US010354791B2

(12) United States Patent
Sasaki

(10) Patent No.: US 10,354,791 B2
(45) Date of Patent: Jul. 16, 2019

(54) ELECTRONIC COMPONENT

(71) Applicant: MURATA MANUFACTURING CO., LTD., Kyoto-fu (JP)

(72) Inventor: Katsufumi Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 177 days.

(21) Appl. No.: 15/488,841

(22) Filed: Apr. 17, 2017

(65) Prior Publication Data
US 2017/0345550 A1   Nov. 30, 2017

(30) Foreign Application Priority Data

May 26, 2016 (JP) .................................. 2016-104815

(51) Int. Cl.
| | | |
|---|---|---|
| *H01F 27/28* | (2006.01) | |
| *H01F 5/00* | (2006.01) | |
| *H01F 27/29* | (2006.01) | |
| *H01F 27/32* | (2006.01) | |
| *H03H 1/00* | (2006.01) | |

(Continued)

(52) U.S. Cl.
CPC ..... *H01F 27/2804* (2013.01); *H01F 17/0013* (2013.01); *H01F 27/292* (2013.01); *H01F 27/323* (2013.01); *H03H 1/00* (2013.01); *H03H 7/427* (2013.01); *H01F 2027/2809* (2013.01); *H03H 2001/0085* (2013.01); *H03H 2001/0092* (2013.01)

(58) Field of Classification Search
CPC ............ H01F 27/2804; H01F 17/0013; H01F 2017/0093

USPC .................................................. 336/170, 200
See application file for complete search history.

(56) References Cited

U.S. PATENT DOCUMENTS 9,269,487 B2 * 2/2016 Yoshida .............. H01F 17/0013
9,762,201 B2 * 9/2017 Park ........................ H03H 7/17
(Continued)

FOREIGN PATENT DOCUMENTS

| JP | 4209851 B2 | 1/2009 |
|---|---|---|
| JP | 2017-92434 A | 5/2017 |

OTHER PUBLICATIONS

An Office Action; "Notification of Reasons for Refusal," Mailed by the Japanese Patent Office dated Nov. 13, 2018, which corresponds to Japanese Patent Application No. 2016-104815 and is related to U.S. Appl. No. 15/488,841; with English language translation.

*Primary Examiner* — Alexander Talpalatski
*Assistant Examiner* — Joselito Baisa
(74) *Attorney, Agent, or Firm* — Studebaker & Brackett PC

(57) ABSTRACT

An electronic component includes a multilayer body, a primary coil including an n-number primary coil conductor layers and one series coil conductor layer, a secondary coil including an n-number secondary coil conductor layers, and a tertiary coil including an n-number tertiary coil conductor layers. The arrangement includes one primary coil conductor layer, one secondary coil conductor layer, and one tertiary coil conductor layer in this order from a first side to a second side of a laminating direction. The series coil conductor layer is electrically connected in series to the n-number primary coil conductor layers and is provided at the second side of the laminating direction with respect to the tertiary coil conductor layer closest to the second side of the laminating direction.

13 Claims, 27 Drawing Sheets

(51) Int. Cl.
  *H03H 7/42*      (2006.01)
  *H01F 17/00*     (2006.01)

(56) References Cited

U.S. PATENT DOCUMENTS

| | | | |
|---|---|---|---|
| 2004/0130415 A1* | 7/2004 | Chiba | H01F 17/0013 333/185 |
| 2004/0135652 A1* | 7/2004 | Uchida | H01F 17/0013 333/185 |
| 2009/0003191 A1* | 1/2009 | Inuzuka | H01F 17/0013 369/283 |
| 2011/0181384 A1* | 7/2011 | Inuduka | C03C 14/004 336/234 |

* cited by examiner

ELECTRONIC COMPONENT

CROSS REFERENCE TO RELATED APPLICATIONS

This application claims benefit of priority to Japanese Patent Application 2016-104815 filed May 26, 2016, the entire content of which is incorporated herein by reference.

TECHNICAL FIELD

The present disclosure relates to an electronic component including a common mode filter.

BACKGROUND

For example, a common mode choke coil described in Japanese Patent No. 4209851 is known as a disclosure related to a common mode filter in related art. FIG. 30 is a cross-sectional view illustrating an exemplary structure of a common mode choke coil 510 described in Japanese Patent No. 4209851. The vertical direction in FIG. 30 is hereinafter simply referred to as a vertical direction.

The common mode choke coil 510 includes a multilayer body 512 and coils 514, 516, and 518. The coils 514, 516, and 518 each form a spiral shape in which the coil winds clockwise from an outer periphery side to an inner periphery side, viewed from the upper side. The coils 514, 516, and 518 are overlapped with each other. The coil 518 is vertically sandwiched between the coil 514 and the coil 516. In the common mode choke coil 510 described above, a high-frequency signal is transmitted to the coils 514 and 516 and ground potential is connected to the coil 518.

SUMMARY

In the common mode choke coil 510 described in Japanese Patent No. 4209851, differential impedances between the coils 514, 516, and 518 are varied, as described below.

As illustrated in FIG. 30, the coil 514 opposes the coil 518 and the coil 516 opposes the coil 518. The coil 518 exists between the coil 514 and the coil 516. Accordingly, the spacing between the coil 514 and the coil 516 is greater than the spacing between the coil 514 and the coil 518 and the spacing between the coil 516 and the coil 518. Consequently, the capacitance generated between the coil 514 and the coil 516 is smaller than the capacitance generated between the coil 514 and the coil 518 and the capacitance generated between the coil 516 and the coil 518. As a result, the differential impedance between the coil 514 and the coil 516 is greater than the differential impedance between the coil 514 and the coil 518 and the differential impedance between the coil 516 and the coil 518.

In contrast, the differential impedance between the coil 514 and the coil 518 is substantially equal to the differential impedance between the coil 516 and the coil 518 because of the spacings between the coils. Accordingly, when a differential signal is transmitted to the coils 514 and 516 as the high-frequency signal and the ground potential is connected to the coil 518, as described above, the possibility of distortion of the waveform of the differential signal is low and the difference in differential impedance is not recognized as an issue in the related art.

The inventor of the present application considered transmission of a high-frequency signal to each of the coils 514, 516, and 518 in the common mode choke coil 510 and reduction of common mode noise from the three high-frequency signals. However, the differential impedance between the coil 514 and the coil 516 is greater than the differential impedance between the coil 514 and the coil 518 and the differential impedance between the coil 516 and the coil 518. Accordingly, for example, in view of the differential signal corresponding to the difference between the three high-frequency signals, the waveform of the differential signal may be distorted after the differential signal has passed through the common mode choke coil 510.

Accordingly, it is an object of the present disclosure to reduce the difference in differential impedance between the respective coils in a common mode filter including three coils.

According to one embodiment of the present disclosure, an electronic component includes a multilayer body having multiple insulating layers laminated in a laminating direction; a primary coil including an n-number (n is a natural number) primary coil conductor layers and one series coil conductor layer provided on the insulating layers; a secondary coil including an n-number secondary coil conductor layers provided on the insulating layers; and a tertiary coil including an n-number tertiary coil conductor layers provided on the insulating layers. The primary coil, the secondary coil, and the tertiary coil compose a common mode filter. Arrangement of one primary coil conductor layer, one secondary coil conductor layer, and one tertiary coil conductor layer in this order from a first side to a second side of the laminating direction composes one coil conductor layer group. N-number coil conductor layer groups are arranged from the first side to the second side of the laminating direction. The series coil conductor layer is electrically connected in series to the n-number primary coil conductor layers and is provided at the second side of the laminating direction with respect to the tertiary coil conductor layer closest to the second side of the laminating direction.

According to the present disclosure, it is possible to reduce the difference in differential impedance between the respective coils in a common mode filter including three coils.

Other features, elements, characteristics and advantages of the present disclosure will become more apparent from the following detailed description with reference to the attached drawings.

DETAILED DESCRIPTION (Configuration of Electronic Component)

Figure 1:
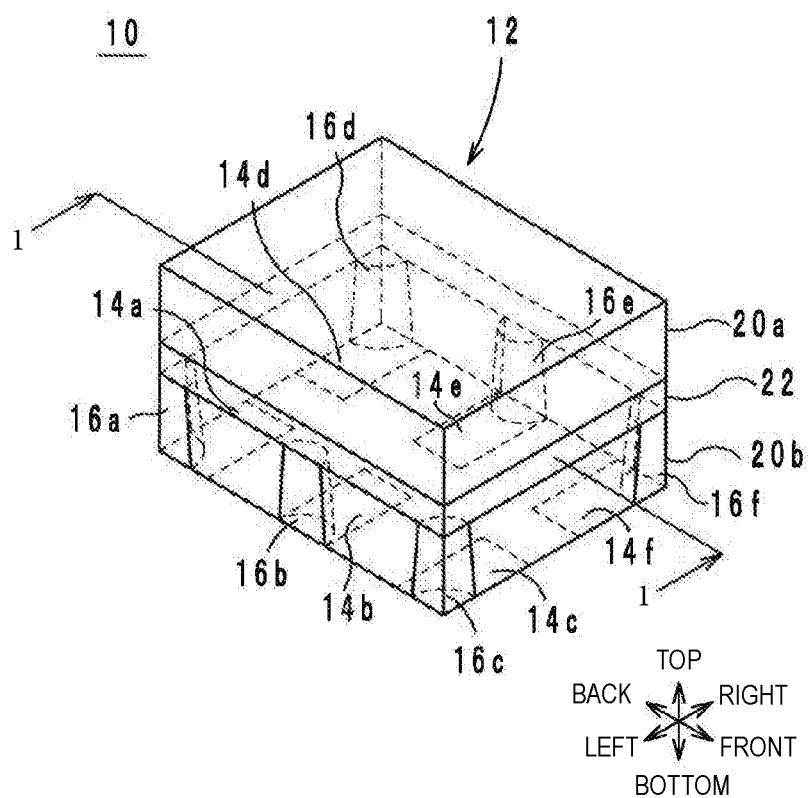
FIG. 1 is an external perspective view of an electronic component according to an embodiment.
Figure 2:
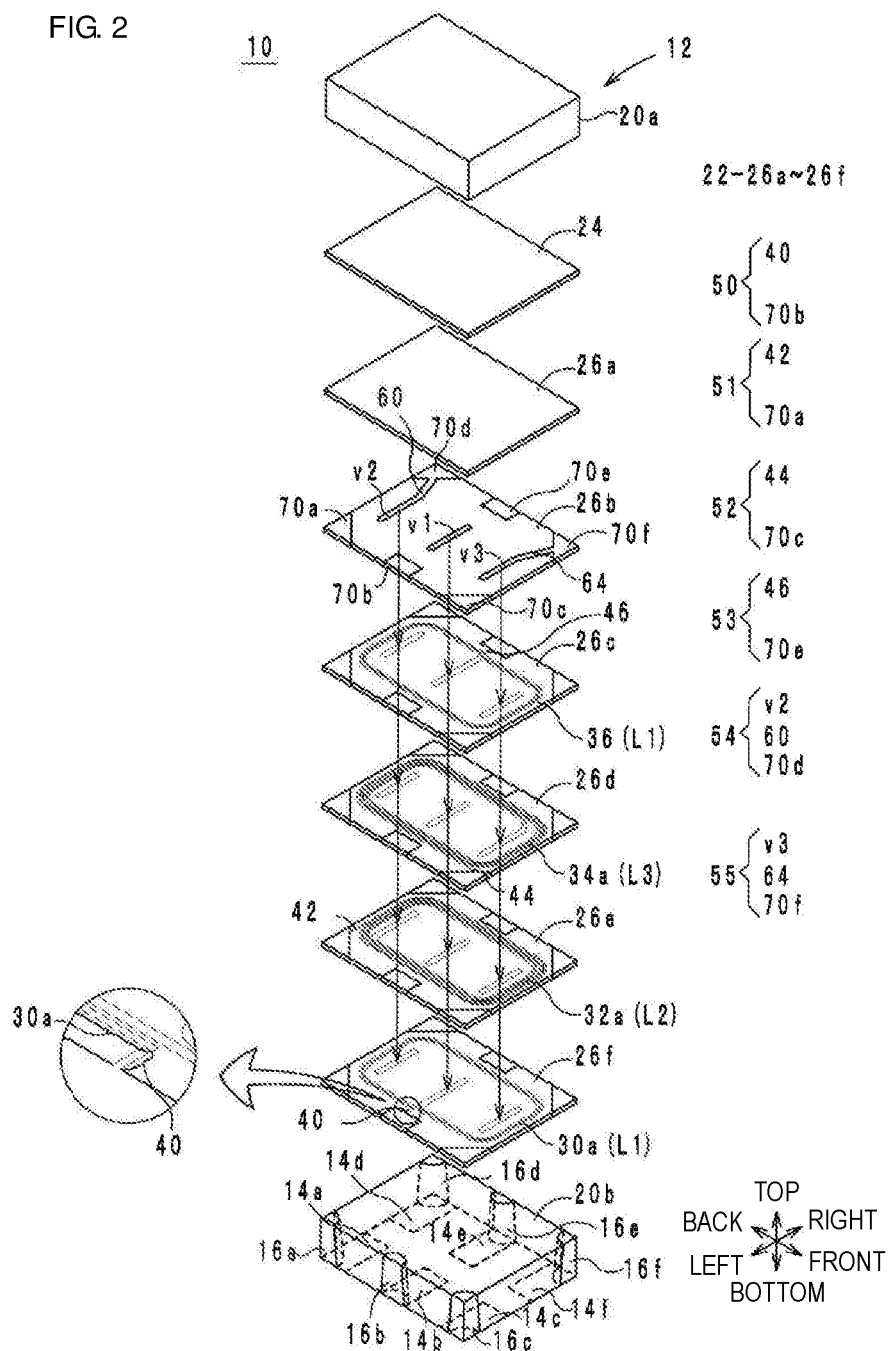
FIG. 2 is an exploded perspective view of the electronic component in FIG. 1.
Figure 3:
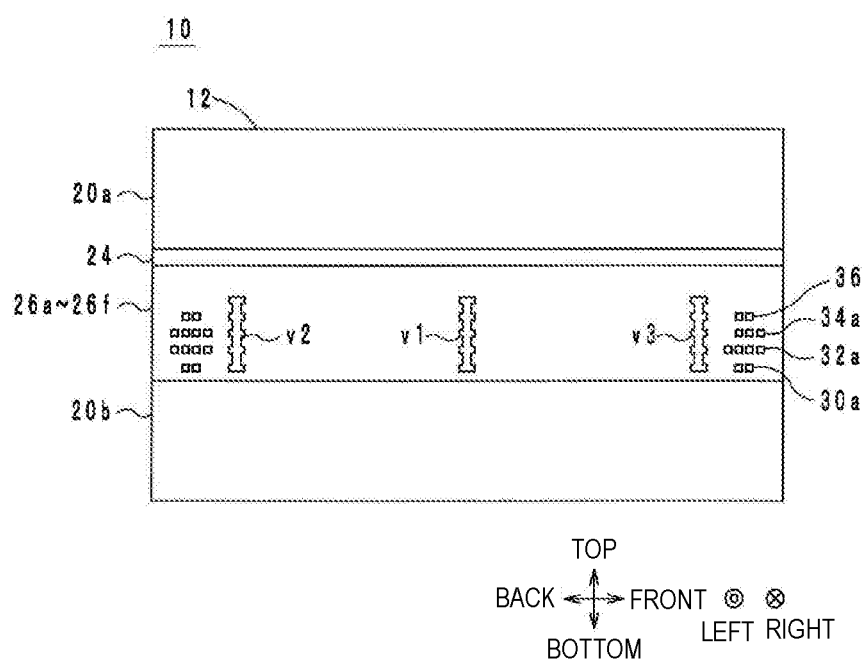
FIG. 3 is a cross-sectional view illustrating an exemplary structure of the electronic component in FIG. 1, taken along line 1-1.
Figure 4:
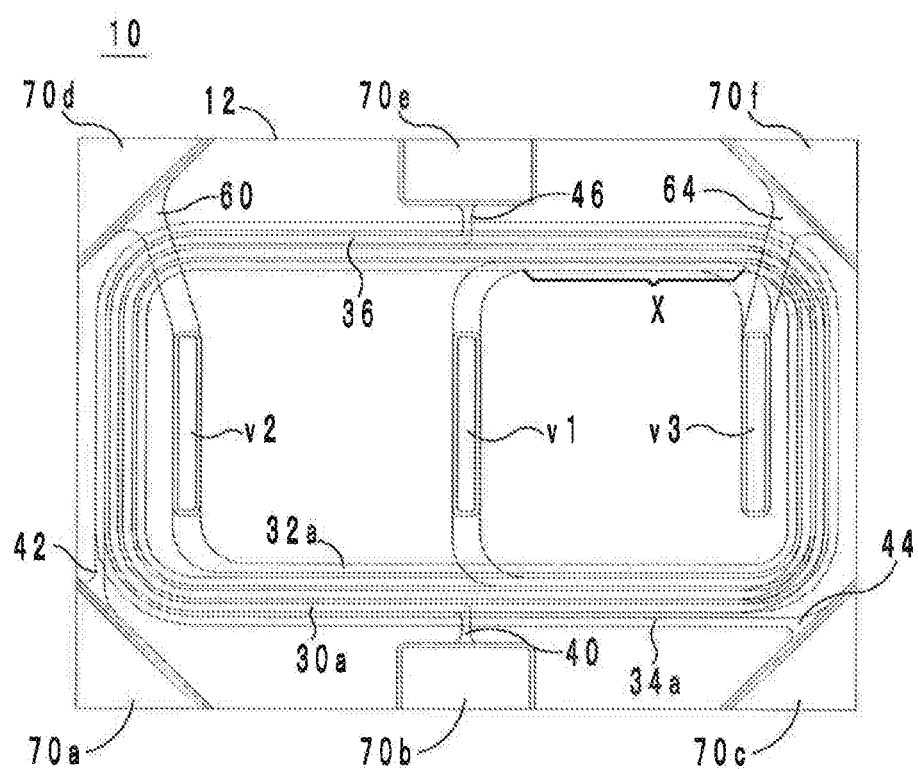
FIG. 4 is a perspective view of the electronic component in FIG. 1, viewed from an upper side.
Figure 4:
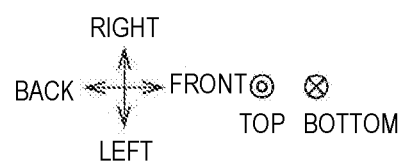

An exemplary configuration of an electronic component according to an embodiment will herein be described with reference to the attached drawings. FIG. 1 is an external perspective view of the electronic component 10. FIG. 2 is an exploded perspective view of the electronic component 10. FIG. 3 is a cross-sectional view illustrating an exemplary structure of the electronic component 10 in FIG. 1, taken along line 1-1. FIG. 4 is a perspective view of the electronic component 10, viewed from the upper side. Coil conductor layers 30a, 32a, and 34a, a series coil conductor layer 36, extended conductor layers 40, 42, 44, 46, 60, and 64, connection conductors 70a to 70f, and inter-layer connection conductors v1 to v3 are illustrated in FIG. 4. A laminating direction of the electronic component 10 is defined as a vertical direction. The direction in which long sides extend, viewed from the upper side, is defined as a front-and-back direction. The direction in which short sides extend, viewed from the upper side, is defined as a left-and-right direction. The vertical direction, the front-and-back direction, and the left-and-right direction are perpendicular to each other. The laminating direction is a direction in which insulating layers described below are laminated on one another.

The electronic component 10 includes a main body 12, outer electrodes 14a to 14f, connection portions 16a to 16f, extended portions 50 to 55, a primary coil L1, a secondary coil L2, and a tertiary coil L3, as illustrated in FIG. 1 to FIG. 3.

The main body 12 has a substantially rectangular parallelepiped shape, as illustrated in FIG. 1 and FIG. 2, and includes magnetic substrates 20a and 20b, a multilayer body 22, and a magnetic layer 24. The magnetic substrate 20a, the magnetic layer 24, the multilayer body 22, and the magnetic substrate 20b are laminated in this order from the upper side to the lower side.

Each of the magnetic substrates 20a and 20b is a plate-like member having a substantially rectangular shape, viewed from the upper side. The upper main face of each of the magnetic substrates 20a and 20b is hereinafter referred to as a top face and the lower main face of each of the magnetic substrates 20a and 20b is hereinafter referred to as a bottom face. The four corners and central portions of the two long sides of the magnetic substrate 20b are notched, viewed from the upper side. More specifically, a substantially fan-shaped notch having a central angle of about 90 degrees is provided at each of the four corners of the magnetic substrate 20b, viewed from the upper side. A substantially semicircular notch is provided in each of the central portions of the two long sides of the magnetic substrate 20b, viewed from the upper side. The six notches extend in the vertical direction on side faces of the magnetic substrate 20b from the top face to the bottom face of the magnetic substrate 20b.

The magnetic substrates 20a and 20b are manufactured by cutting out sintered ferrite ceramics. The magnetic substrates 20a and 20b may be manufactured through thermosetting of magnetic paste containing magnetic powder, such as ferrite calcined powder or metal powder, and binder, such as resin, or application of the magnetic paste on a ceramic substrate made of alumina or the like or may be manufactured by laminating and firing green sheets made of a ferrite material.

The outer electrodes 14a to 14f are provided on the bottom face of the magnetic substrate 20b and each form a substantially rectangular shape. More specifically, the outer electrode 14a is provided at a back left corner of the bottom face of the magnetic substrate 20b. The outer electrode 14b is provided in a central portion of the left long side of the bottom face of the magnetic substrate 20b. The outer electrode 14c is provided at a front left corner of the bottom face of the magnetic substrate 20b. The outer electrode 14d (an example of a second outer electrode) is provided at a back right corner of the bottom face of the magnetic substrate 20b. The outer electrode 14e (an example of a first outer electrode) is provided in a central portion of the right long side of the bottom face of the magnetic substrate 20b. The outer electrode 14f (an example of a third outer electrode) is provided at a front right corner of the bottom face of the magnetic substrate 20b. The outer electrodes 14a to 14f are each manufactured by laminating Ag, Ni, Cu, Ti, or the like using a sputtering method and forming a film. The outer electrodes 14a to 14f may be each manufactured by printing and baking paste containing metal or may be each manufactured by forming a metal film using a vapor deposition method or a plating method.

The connection portions 16a to 16f are provided on the six notches provided in the magnetic substrate 20b. Specifically, the connection portion 16a is provided on the notch at the back left corner of the magnetic substrate 20b and is connected to the outer electrode 14a at its lower end portion. The connection portion 16b is provided on the notch in the central portion of the left long side of the magnetic substrate 20b and is connected to the outer electrode 14b at its lower end portion. The connection portion 16c is provided on the notch at the front left corner of the magnetic substrate 20b and is connected to the outer electrode 14c at its lower end portion. The connection portion 16d is provided on the notch at the back right corner of the magnetic substrate 20b and is connected to the outer electrode 14d at its lower end portion. The connection portion 16e is provided on the notch in the central portion of the right long side of the magnetic substrate 20b and is connected to the outer electrode 14e at its lower end portion. The connection portion 16f is provided on the notch at the front right corner of the magnetic substrate 20b and is connected to the outer electrode 14f at its lower end portion. The connection portions 16a to 16f are each manufactured by forming a conductor film containing Cu, Ag, Au, or the like as a major component using the plating method. The connection portions 16a to 16f may be each made of a material, such as Ag or Au, having high electrical conductivity.

The multilayer body 22 has a structure in which insulating layers 26a to 26f (an example of multiple insulating layers) are laminated on the top face of the magnetic substrate 20b and has a substantially rectangular shape, viewed from the upper side. The insulating layers 26a to 26f are laminated in this order from the upper side to the lower side and have substantially the same size as that of the top face of the magnetic substrate 20b. However, the four corners and the central portions of the two long sides of each of the insulating layers 26b to 26f are notched, viewed from the upper side.

The insulating layers 26a to 26f are made of polyimide. The insulating layers 26a to 26f may be made of insulating resin, such as benzocyclobutene, or may be made of an insulating inorganic material, such as glass ceramics. The upper main face of each of the insulating layers 26a to 26f is hereinafter referred to as a top face and the lower main face of each of the insulating layers 26a to 26f is hereinafter referred to as a bottom face.

The magnetic layer 24 is provided between the multilayer body 22 and the magnetic substrate 20a. The magnetic layer 24 flattens the top face of the multilayer body 22 and joins the multilayer body 22 to the magnetic substrate 20a. The magnetic layer 24 is made of, for example, the magnetic paste described above.

The primary coil L1 is provided in the multilayer body and includes the coil conductor layer 30a, the series coil conductor layer 36, and the inter-layer connection conductor v1. The coil conductor layer 30a is provided on the top face of the insulating layer 26f and has a spiral shape in which the coil conductor winds clockwise (an example of a certain direction) from an outer periphery side to an inner periphery side, viewed from the upper side. In the present embodiment, the coil conductor layer 30a has a length of about two laps. The center of the coil conductor layer 30a substantially coincides with the center (the intersection of diagonal lines) of the electronic component 10, viewed from the upper side.

The series coil conductor layer 36 is electrically connected in series to the coil conductor layer 30a and is provided at the upper side of the coil conductor layer 34a described below. The series coil conductor layer 36 is provided on the top face of the insulating layer 26c and has a spiral shape in which the coil conductor winds clockwise from the inner periphery side to the outer periphery side, viewed from the upper side. In the present embodiment, the series coil conductor layer 36 has a length of about two laps. Accordingly, the number of turns of the coil conductor layer 30a (an example of a certain primary coil conductor layer) is substantially equal to the number of turns of the series coil conductor layer 36. The center of the series coil conductor layer 36 substantially coincides with the center (the intersection of diagonal lines) of the electronic component 10, viewed from the upper side. The distance (pitch) between lines that are adjacent to each other in a radial direction in the series coil conductor layer 36 is substantially equal to the distance between lines that are adjacent to each other in the radial direction in the coil conductor layer 30a. The radial direction is a direction directed from the inner periphery side to the outer periphery side of the coil conductor layer and the series coil conductor layer.

The inter-layer connection conductor v1 passes through the insulating layers 26b to 26e in the vertical direction and is provided on the top face of the insulating layer 26f. The inter-layer connection conductor v1 has a substantially linear shape that extends in the left-and-right direction, viewed from the upper side, and is provided near the centers of the insulating layers 26b to 26f. The inter-layer connection conductor v1 connects the end portion of the inner periphery side of the coil conductor layer 30a to the end portion of the inner periphery side of the series coil conductor layer 36. Accordingly, the coil conductor layer 30a is electrically connected in series to the series coil conductor layer 36.

The extended portion 50 connects one end of the primary coil L1 (the end portion at the outer periphery side of the coil conductor layer 30a) to the outer electrode 14b. The extended portion 50 includes the extended conductor layer 40 and the connection conductor 70b. The connection conductor 70b is a substantially quadrangular prism conductor provided in central portions of the left long sides of the insulating layers 26b to 26f. The connection conductor 70b is illustrated by being divided into five portions in FIG. 2 for convenience. Each of the connection conductors 70a and 70c to 70f described below is also illustrated with being divided into five portions, as in the connection conductor 70b. The connection conductor 70b extends in the vertical direction from the top face of the insulating layer 26b to the bottom face of the insulating layer 26f and is connected to the connection portion 16b at its lower end portion.

The extended conductor layer 40 is provided on the top face of the insulating layer 26f. The extended conductor layer 40 is connected to the end portion at the outer periphery side of the coil conductor layer 30a and is connected to the connection conductor 70b. The extended conductor layer 40 does not have a spiral shape, viewed from the upper side, and extends leftward from the end portion at the outer periphery side of the coil conductor layer 30a. The boundary between the coil conductor layer 30a and the extended conductor layer 40 is at a position where the extended conductor layer 40 steps away from the spiral path formed by the coil conductor layer 30a, as illustrated in an enlarged view in FIG. 2. Accordingly, one end of the primary coil L1 (the end portion at the outer periphery side of the coil conductor layer 30a) is connected to the outer electrode 14b with the extended portion 50 (the extended conductor layer 40 and the connection conductor 70b) and the connection portion 16b interposed therebetween.

The extended portion 53 (an example of a first extended portion) connects the other end of the primary coil L1 (the end portion at the outer periphery side of the series coil conductor layer 36) to the outer electrode 14e (an example of the first outer electrode). The extended portion 53 includes the extended conductor layer 46 and the connection conductor 70e. The connection conductor 70e is a substantially quadrangular prism conductor provided in central portions of the right long sides of the insulating layers 26b to 26f. The connection conductor 70e extends in the vertical direction from the top face of the insulating layer 26b to the bottom face of the insulating layer 26f and is connected to the connection portion 16e at its lower end portion.

The extended conductor layer 46 is provided on the top face of the insulating layer 26c. The extended conductor layer 46 is connected to the end portion at the outer periphery side of the series coil conductor layer 36 and is connected to the connection conductor 70e. The extended conductor layer 46 does not have a spiral shape, viewed from the upper side, and extends rightward from the end portion at the outer periphery side of the series coil conductor layer 36. The boundary between the series coil conductor layer 36 and the extended conductor layer 46 is at a position where the extended conductor layer 46 steps away from the spiral path formed by the series coil conductor layer 36. Accordingly, the other end of the primary coil L1 (the end portion at the outer periphery side of the series coil conductor layer 36) is connected to the outer electrode 14e with the extended portion 53 (the extended conductor layer 46 and the connection conductor 70e) and the connection portion 16e interposed therebetween.

The secondary coil L2 is provided in the multilayer body 22 and includes the coil conductor layer 32a (an example of a secondary coil conductor layer). The coil conductor layer 32a is provided on the top face of the insulating layer 26e and has a spiral shape in which the coil conductor winds clockwise from the outer periphery side to the inner periphery side, viewed from the upper side. In the present embodiment, the coil conductor layer 32a has a length of about four laps.

Accordingly, the number of turns of the coil conductor layer 30a is half of the number of turns of the coil conductor layer 32a adjacent to the coil conductor layer 30a. The center of the coil conductor layer 32a substantially coincides with the center (the intersection of diagonal lines) of the electronic component 10, viewed from the upper side. The distance (pitch) between lines that are adjacent to each other in the radial direction in the coil conductor layer 32a is substantially equal to the distance between lines that are adjacent to each other in the radial direction in the coil conductor layer 30a and the series coil conductor layer 36.

The coil conductor layer 32a is overlapped with the coil conductor layer 30a, viewed from the upper side, as illustrated in FIG. 2 and FIG. 3. Specifically, the intermediate line between the portion winding at the outermost side of the coil conductor layer 30a (an example of the certain primary coil conductor layer) and the portion winding at the innermost side thereof is at least partially overlapped with the intermediate line between the portion winding at the outermost side of the coil conductor layer 32a (an example of the secondary coil conductor layer adjacent to the certain primary coil conductor layer in the laminating direction) and the portion winding at the innermost side thereof, viewed from the upper side. More specially, the coil conductor layer 32a has a length of about four laps. The coil conductor layer 30a has a length of about two laps. Accordingly, the number of turns of the coil conductor layer 30a is half of the number of turns of the coil conductor layer 32a, viewed from the upper side. The coil conductor layer 30a is not overlapped with one lap at the innermost side and one lap at the outermost side of the coil conductor layer 32a. The coil conductor layer 30a is overlapped with part of the two intermediate laps of the coil conductor layer 32a, viewed from the upper side. Accordingly, the coil conductor layer 32a exists at the inner periphery side and the outer periphery side with respect to the coil conductor layer 30a, viewed from the upper side.

Since the coil conductor layers 30a and 32a have the above structures, an area surrounded by the coil conductor layer 30a (an inner magnetic path of the primary coil L1) is overlapped with an area surrounded by the coil conductor layer 32a (an inner magnetic path of the secondary coil L2), viewed from the upper side. Accordingly, the coil conductor layer 30a is magnetically coupled to the coil conductor layer 32a. However, the position of the end portion at the outer periphery side of the coil conductor layer 30a is shifted from the position of the end portion at the outer periphery side of the coil conductor layer 32a so that the extended portion 50 does not interfere with the extended portion 51 described below. Specifically, the end portion at the outer periphery side of the coil conductor layer 32a is positioned at the downstream side of the end portion at the outer periphery side of the coil conductor layer 30a in a clockwise direction.

The extended portion 51 connects one end of the secondary coil L2 (the end portion at the outer periphery side of the coil conductor layer 32a) to the outer electrode 14a. The extended portion 51 includes the extended conductor layer 42 and the connection conductor 70a. The connection conductor 70a is a substantially triangular prism conductor provided at the back left corners of the insulating layers 26b to 26f. The connection conductor 70a extends in the vertical direction from the top face of the insulating layer 26b to the bottom face of the insulating layer 26f and is connected to the connection portion 16a at its lower end portion.

The extended conductor layer 42 is provided on the top face of the insulating layer 26e. The extended conductor layer 42 is connected to the end portion at the outer periphery side of the coil conductor layer 32a and is connected to the connection conductor 70a. The extended conductor layer 42 does not have a spiral shape, viewed from the upper side, and extends leftward from the end portion at the outer periphery side of the coil conductor layer 32a. Accordingly, one end of the secondary coil L2 (the end portion at the outer periphery side of the coil conductor layer 32a) is connected to the outer electrode 14a with the extended portion 51 (the extended conductor layer 42 and the connection conductor 70a) and the connection portion 16a interposed therebetween.

The extended portion 54 (an example of a second extended portion) connects the other end of the secondary coil L2 (the end portion at the inner periphery side of the coil conductor layer 32a) to the outer electrode 14d. The extended portion 54 includes the inter-layer connection conductor v2, the extended conductor layer 60 (an example of a first extended conductor layer), and the connection conductor 70d. The connection conductor 70d is a substantially triangular prism conductor provided at the back right corners of the insulating layers 26b to 26f. The connection conductor 70d extends in the vertical direction from the top face of the insulating layer 26b to the bottom face of the insulating layer 26f and is connected to the connection portion 16d at its lower end portion.

The inter-layer connection conductor v2 passes through the insulating layers 26b to 26e in the vertical direction and is provided on the top face of the insulating layer 26f. The inter-layer connection conductor v2 has a substantially linear shape that extends in the left-and-right direction, viewed from the upper side, and is provided in rear half areas of the insulating layers 26b to 26f. The inter-layer connection conductor v2 is positioned in an area surrounded by the series coil conductor layer 36. The inter-layer connection conductor v2 is connected to the end portion at the inner periphery side of the coil conductor layer 32a.

The extended conductor layer 60 is positioned at the upper side of the series coil conductor layer 36 and is overlapped with part of the series coil conductor layer 36, viewed from the upper side. More specifically, the extended conductor layer 60 is provided on the top face of the insulating layer 26b and intersects with the series coil conductor layer 36, viewed from the upper side. The extended conductor layer 60 is connected to the inter-layer connection conductor v2 and is connected to the connection conductor 70d. Accordingly, the other end of the secondary coil L2 (the end portion at the inner periphery side of the coil conductor layer 32a) is connected to the outer electrode 14d with the extended portion 54 (the inter-layer connection conductor v2, the extended conductor layer 60, and the connection conductor 70d) and the connection portion 16d interposed therebetween.

The tertiary coil L3 is provided in the multilayer body and includes the coil conductor layer 34a (an example of a tertiary coil conductor layer). The coil conductor layer 34a is provided on the top face of the insulating layer 26d and has a spiral shape in which the coil conductor winds clockwise from the outer periphery side to the inner periphery side, viewed from the upper side. In the present embodiment, the coil conductor layer 34a has a length of about four laps. Accordingly, the number of turns of the series coil conductor layer 36 is half of the number of turns of the coil conductor layer 34a (an example of the tertiary coil conductor layer closest to the other side of the laminating direction). The center of the coil conductor layer 34a substantially coincides with the center (the intersection of diagonal lines) of the electronic component 10, viewed from the upper side. The distance (pitch) between lines that are adjacent to each other in the radial direction in the coil conductor layer 34a is substantially equal to the distance between lines that are adjacent to each other in the radial direction in the coil conductor layers 30a and 32a and the series coil conductor layer 36.

The coil conductor layer 34a substantially wholly overlapped with the coil conductor layer 32a, viewed from the upper side, as illustrated in FIG. 2 and FIG. 3. Accordingly, the area surrounded by the coil conductor layer 32a (the inner magnetic path of the secondary coil L2) is overlapped with an area surrounded by the coil conductor layer 34a (an inner magnetic path of the tertiary coil L3), viewed from the upper side. Accordingly, the coil conductor layer 32a is magnetically coupled to the coil conductor layer 34a. However, the positions of both ends of the coil conductor layer 32a are shifted from the positions of both ends of the coil conductor layer 34a so that the extended portions 51 and 54 do not interfere with the extended portions 52 and 55. Specifically, the end portion at the outer periphery side of the coil conductor layer 34a is positioned at the upstream side of the end portion at the outer periphery side of the coil conductor layer 32a in the clockwise direction. The end portion at the inner periphery side of the coil conductor layer 34a is positioned at the upstream side of the end portion at the inner periphery side of the coil conductor layer 32a in the clockwise direction. Accordingly, the length of the coil conductor layer 32a is substantially equal to the length of the coil conductor layer 34a. Since it is sufficient for the coil conductor layer 32a to be magnetically coupled to the coil conductor layer 34a, the coil conductor layer 32a may not necessarily be overlapped with the coil conductor layer 34a substantially wholly and the coil conductor layer 32a may be slightly shifted from the coil conductor layer 34a in the front-and-back direction or in the left-and-right direction.

The coil conductor layer 34a is overlapped with the series coil conductor layer 36, viewed from the upper side, as illustrated in FIG. 2 and FIG. 3. Specifically, the intermediate line between the portion winding at the outermost side of the series coil conductor layer 36 and the portion winding at the innermost side thereof is at least partially overlapped with the intermediate line between the portion winding at the outermost side of the coil conductor layer 34a (an example of the tertiary coil conductor layer closest to the second side of the laminating direction) and the portion winding at the innermost side thereof. More specially, the coil conductor layer 34a has a length of about four laps. The series coil conductor layer 36 has a length of about two laps. The series coil conductor layer 36 is not overlapped with one lap at the outermost side of the coil conductor layer 34a. In addition, the series coil conductor layer 36 is not overlapped with most of one lap at the innermost side of the coil conductor layer 34a, viewed from the upper side, as illustrated in FIG. 4. However, a portion near the end portion at the inner periphery side (refer to reference numeral X in FIG. 4) of the series coil conductor layer 36 is overlapped with one lap at the innermost side of the coil conductor layer 34a. The series coil conductor layer 36 is overlapped with part of the two intermediate laps of the coil conductor layer 34a, viewed from the upper side. Accordingly, the coil conductor layer 34a exists at the inner periphery side and the outer periphery side with respect to the series coil conductor layer 36, viewed from the upper side.

Since the coil conductor layers 34a and 36 have the above structures, the area surrounded by the coil conductor layer 34a (the inner magnetic path of the tertiary coil L3) is overlapped with the area surrounded by the series coil conductor layer 36 (the inner magnetic path of the primary coil L1), viewed from the upper side. Accordingly, the coil conductor layer 34a is magnetically coupled to the series coil conductor layer 36.

In addition, the position of the end portion at the outer periphery side of the coil conductor layer 34a is shifted from the position of the end portion at the outer periphery side of the coil conductor layer 30a so that the extended portion 50 does not interfere with the extended portion 52 described below. Specifically, the end portion at the outer periphery side of the coil conductor layer 34a is positioned at the upstream side of the end portion at the outer periphery side of the coil conductor layer 30a in the clockwise direction.

The extended portion 52 connects one end of the tertiary coil L3 (the end portion at the outer periphery side of the coil conductor layer 34*a*) to the outer electrode 14*c*. The extended portion 52 includes the extended conductor layer 44 and the connection conductor 70*c*. The connection conductor 70*c* is a substantially triangular prism conductor provided at the front left corners of the insulating layers 26*b* to 26*f*. The connection conductor 70*c* extends in the vertical direction from the top face of the insulating layer 26*b* to the bottom face of the insulating layer 26*f* and is connected to the connection portion 16*c* at its lower end portion.

The extended conductor layer 44 is provided on the top face of the insulating layer 26*d*. The extended conductor layer 44 is connected to the end portion at the outer periphery side of the coil conductor layer 34*a* and is connected to the connection conductor 70*c*. The extended conductor layer 44 does not have a spiral shape, viewed from the upper side, and extends forward from the end portion at the outer periphery side of the coil conductor layer 34*a*. Accordingly, one end of the tertiary coil L3 (the end portion at the outer periphery side of the coil conductor layer 34*a*) is connected to the outer electrode 14*c* with the extended portion 52 (the extended conductor layer 44 and the connection conductor 70*c*) and the connection portion 16*c* interposed therebetween.

The extended portion 55 (an example of a third extended portion) connects the other end of the tertiary coil L3 (the end portion at the inner periphery side of the coil conductor layer 34*a*) to the outer electrode 14*f*. The extended portion 55 includes the inter-layer connection conductor v3, the extended conductor layer 64, and the connection conductor 70*f*. The connection conductor 70*f* is a substantially triangular prism conductor provided at the front right corners of the insulating layers 26*b* to 26*f*. The connection conductor 70*f* extends in the vertical direction from the top face of the insulating layer 26*b* to the bottom face of the insulating layer 26*f* and is connected to the connection portion 16*f* at its lower end portion.

The inter-layer connection conductor v3 passes through the insulating layers 26*b* to 26*e* in the vertical direction and is provided on the top face of the insulating layer 26*f*. The inter-layer connection conductor v3 has a substantially linear shape that extends in the left-and-right direction, viewed from the upper side, and is provided in front half areas of the insulating layers 26*b* to 26*f*. The inter-layer connection conductor v3 is positioned in the area surrounded by the series coil conductor layer 36. The inter-layer connection conductor v3 is connected to the end portion at the inner periphery side of the coil conductor layer 34*a*.

The extended conductor layer 64 is positioned at the upper side of the series coil conductor layer 36 and is overlapped with part of the series coil conductor layer 36, viewed from the upper side. More specifically, the extended conductor layer 64 is provided on the top face of the insulating layer 26*b* and intersects with the series coil conductor layer 36, viewed from the upper side. The extended conductor layer 64 is connected to the inter-layer connection conductor v3 and is connected to the connection conductor 70*f*. Accordingly, the other end of the tertiary coil L3 (the end portion at the inner periphery side of the coil conductor layer 34*a*) is connected to the outer electrode 14*f* with the extended portion 55 (the inter-layer connection conductor v3, the extended conductor layer 64, and the connection conductor 70*f*) and the connection portion 16*f* interposed therebetween.

The coil conductor layers 30*a*, 32*a*, and 34*a*, the series coil conductor layer 36, the extended conductor layers 40, 42, 44, 46, 60, and 64, and the connection conductors 70*a* to 70*f* are each manufactured by forming a film made of a material, such as Ag, Cu, or Au, having high electrical conductivity using the sputtering method. The coil conductor layers 30*a*, 32*a*, and 34*a*, the series coil conductor layer 36, the extended conductor layers 40, 42, 44, 46, 60, and 64, and the connection conductors 70*a* to 70*f* may be manufactured using a printing method, the vapor deposition method, or the plating method.

As described above, the coil conductor layer 30*a* is connected in series to the series coil conductor layer 36 with the inter-layer connection conductor v1 interposed therebetween and has substantially the same length (number of turns). In addition, the sum of the length of the coil conductor layer 30*a*, the length of the series coil conductor layer 36, and the length of a portion connecting the coil conductor layer 30*a* to the series coil conductor layer 36 in the inter-layer connection conductor v1 is substantially equal to the length of the coil conductor layer 32*a* and the length of the coil conductor layer 34*a*. Accordingly, the primary coil L1, the secondary coil L2, and the tertiary coil L3 have current paths having substantially the same length. Having current paths having substantially the same length means that, since the arrangement of the coil conductor layers so that the extended portions 50 to 55 do not interfere with each other makes the difference between the sum of the length of the coil conductor layer 30*a*, the length of the series coil conductor layer 36, and the length of the portion connecting the coil conductor layer 30*a* to the series coil conductor layer 36 in the inter-layer connection conductor v1 and the length of the coil conductor layer 32*a* and the difference between the sum and the length of the coil conductor layer 34*a* sufficiently smaller than the lengths of the primary coil L1, the secondary coil L2, and the tertiary coil L3, the above differences are not substantial.

In addition, the cross-sectional area of the coil conductor layer 30*a*, the cross-sectional area of the series coil conductor layer 36, the cross-sectional area of the coil conductor layer 32*a*, and the cross-sectional area of the coil conductor layer 34*a* are substantially equal to each other. More specifically, the line width of the coil conductor layer 30*a*, the line width of the coil conductor layer 32*a*, the line width of the coil conductor layer 34*a*, and the line width of the series coil conductor layer 36 are substantially equal to each other, as illustrated in FIG. 3. Furthermore, the thickness of the coil conductor layer 30*a*, the thickness of the coil conductor layer 32*a*, the thickness of the coil conductor layer 34*a*, and the thickness of the series coil conductor layer 36 are substantially equal to each other.

Furthermore, the length of the coil conductor layer 30*a* and the length of the series coil conductor layer 36 are half of the lengths of the coil conductor layers 32*a* and 34*a*, as described above.

The cross-sectional area of the coil conductor layer in the above description means the cross-sectional area on a cross section perpendicular to the direction in which the coil conductor layer extends. The thickness of the coil conductor layer means the thickness in the vertical direction of the coil conductor layer. The line width of the coil conductor layer means the width in a direction perpendicular to the vertical direction of the coil conductor layer on a cross section perpendicular to the direction in which the coil conductor layer extends.

The spacing between the coil conductor layer 30*a* and the coil conductor layer 32*a*, the spacing between the coil conductor layer 32*a* and the coil conductor layer 34*a*, and the spacing between the coil conductor layer 34*a* and the series coil conductor layer 36 are substantially equal to each other. In other words, the vertical spacings between adjacent coil conductor layers, among the coil conductor layers 30a, 32a, and 34a and the series coil conductor layer 36, are substantially equal to each other. The spacing between the coil conductor layers means the distance between opposing faces of two coil conductor layers.

In the electronic component 10 having the above structure, the primary coil L1 is magnetically coupled to the secondary coil L2, the secondary coil L2 is magnetically coupled to the tertiary coil L3, and the tertiary coil L3 is magnetically coupled to the primary coil L1.

An exemplary operation of the electronic component 10 having the above structure will now be described. The outer electrodes 14a to 14c are used as input terminals and the outer electrodes 14d to 14f are used as output terminals.

A first signal S1 is input into the outer electrode 14b, a second signal S2 is input into the outer electrode 14a, and a third signal S3 is input into the outer electrode 14c. It is assumed that the first signal S1, the second signal S2, and the third signal S3 described below are used. The first signal S1, the second signal S2, and the third signal S3 take three different arbitrary voltage values: High (H), Middle (M), and Low (L) and make transition between the three values: H, M, and L at the same clock. In addition, at a timing when a signal takes a value of H, one of the remaining two signals takes a value of M and the other of the remaining two signals takes a value of L. In other words, the first signal S1, the second signal S2, and the third signal S3 exclusively make transition between the three values: H, M, and L. Here, the sum of the voltage values of the first signal S1, the second signal S2, and the third signal S3 is constantly kept at an almost constant value (H+M+L) and the "total" amount of change in the voltage due to the transition is substantially equal to zero. Accordingly, the "total" amount of change in current occurring in the primary coil L1, the secondary coil L2, and the tertiary coil L3 is substantially equal to zero and the amount of change in magnetic flux occurring in the electronic component 10 is substantially equal to zero (although the magnetic flux occurring in each of the primary coil L1, the secondary coil L2, and the tertiary coil L3 is varied, the variations in the magnetic flux are offset). Since impedance does not substantially occur in the electronic component 10 when the magnetic flux is not substantially changed, as described above, the electronic component 10 does not affect the first signal S1, the second signal S2, and the third signal S3.

In contrast, the magnetic fluxes caused by the primary coil L1, the secondary coil L2, and the tertiary coil L3 are varied in the same direction for common mode noise, that is, for noise of the same phase included in the first signal S1, the second signal S2, and the third signal S3 and the variations in the magnetic flux are not offset and reinforced. Accordingly, the electronic component 10 has high impedance for the common mode noise and, thus, is capable of reducing the common mode noise. As described above, the electronic component 10 does not affect the first signal S1, the second signal S2, and the third signal S3 and is capable of reducing the common mode noise. The primary coil L1, the secondary coil L2, and the tertiary coil L3 compose a common mode filter for the first signal S1, the second signal S2, and the third signal S3.

(Method of Manufacturing Electronic Component)

An exemplary method of manufacturing the electronic component 10 will now be described with reference to the drawings. Although a case will be exemplified in which one electronic component 10 is manufactured, practically, a large mother magnetic substrate and mother insulating layers are laminated to manufacture a mother board and the mother board is cut to manufacture multiple electronic components 10 at one time.

First, polyimide resin, which is photosensitive resin, is applied on the entire top face of the magnetic substrate 20b. Next, the positions corresponding to the four corners and the central portions of the two long sides of the insulating layer 26f are shaded for exposure. This hardens the polyimide resin in an unshaded portion. Then, the polyimide resin that is not hardened is removed by removing photoresist with organic solvent and performing development and thermosetting is performed. This forms the insulating layer 26f.

Next, an Ag film is formed on the insulating layer 26f and the magnetic substrate 20b exposed from the insulating layer 26f using the sputtering method. Next, the photoresist is formed on a portion where the coil conductor layer 30a, the extended conductor layer 40, the connection conductors 70a to 70f, and the inter-layer connection conductors v1 to v3 are to be formed. The Ag film on the portion excluding the portion where the coil conductor layer 30a, the extended conductor layer 40, the connection conductors 70a to 70f, and the inter-layer connection conductors v1 to v3 are to be formed (that is, the portion covered with the photoresist) is removed by an etching method. Then, the photoresist is removed with the organic solvent to form the coil conductor layer 30a, the extended conductor layer 40, part of the connection conductors 70a to 70f (one layer), and part of the inter-layer connection conductors v1 to v3 (one layer).

A process similar to the above one is repeated to form the insulating layers 26a to 26e, the coil conductor layers 32a and 34a, the series coil conductor layer 36, the extended conductor layers 42, 44, 46, 60, and 64, the remaining portion of the connection conductors 70a to 70f, and the remaining portion of the inter-layer connection conductors v1 to v3.

Next, magnetic paste to be used as the magnetic layer is applied on the multilayer body 22 and the magnetic substrate 20a is pressure-bonded on the magnetic layer 24.

Next, the six notches are formed on the magnetic substrate 20b using a sandblasting method. The notches may be formed using a laser processing method, instead of the sandblasting method, or may be formed using a combination of the sandblasting method and the laser processing method.

Finally, the conductor layers are formed on the inner peripheries of the notches of the magnetic substrate 20b using a combination of an electric field plating method and a photolithographic method to form the connection portions 16a to 16f and the outer electrodes 14a to 14f.

(Advantages)

With the electronic component 10 according to the present embodiment, it is possible to reduce the difference in the differential impedance between the primary coil L1 to the tertiary coil L3. More specifically, the differential impedance is represented by a square root of L/C where L denotes the inductance value and C denotes the capacitance value of the entire electronic component 10 including the coils when measurement current (or the differential signal) flows. The capacitance value C includes the capacitance (parasitic capacitance) between the coil conductor layers. In the electronic component 10, the inner diameter area of the primary coil L1, the inner diameter area of the secondary coil L2, and the inner diameter area of the tertiary coil L3 are substantially equal to each other in the current paths of the primary coil L1, the secondary coil L2, and the tertiary coil L3. In addition, the primary coil L1, the secondary coil L2, and tertiary coil L3 have the current paths having substantially the same length and have substantially the same number of turns. Accordingly, the inductance values of the primary coil L1 to the tertiary coil L3 are substantially equal to each other.

For example, also in the common mode choke coil 510 in the related art, the inductance values of the coils 514, 516, and 518 are substantially equal to each other, as in the electronic component 10. However, as described above, since the spacing between the coil 514 and the coil 516 is greater than the spacing between the coil 514 and the coil 518 and the spacing between the coil 516 and the coil 518, the capacitance generated between the coil 514 and the coil 516 is smaller than the capacitance generated between the coil 514 and the coil 518 and the capacitance generated between the coil 516 and the coil 518. Accordingly, the differential impedance between the coil 514 and the coil 516 is greater than the differential impedance between the coil 514 and the coil 518 and the differential impedance between the coil 516 and the coil 518.

In the electronic component 10, the series coil conductor layer 36 is provided at the upper side of the coil conductor layer 34a, which is the uppermost coil conductor layer among the coil conductor layers 30a, 32a, and 34a. Capacitance is generated between the coil conductor layer 34a and the series coil conductor layer 36 with this structure. The capacitance between the primary coil L1 and the secondary coil L2 is mainly formed by the capacitance between the coil conductor layer 30a and the coil conductor layer 32a. The capacitance between the secondary coil L2 and the tertiary coil L3 is mainly formed by the capacitance between the coil conductor layer 32a and the coil conductor layer 34a. The capacitance between the tertiary coil L3 and the primary coil L1 is mainly formed by the capacitance between the coil conductor layer 30a and the coil conductor layer 34a and the capacitance between the series coil conductor layer 36 and the coil conductor layer 34a. In other words, in the electronic component 10, the capacitance between the tertiary coil L3 and the primary coil L1 is formed not only between the coil conductor layer 30a and the coil conductor layer 34a, the spacing between which is large, but also between the series coil conductor layer 36 and the coil conductor layer 34a, the spacing between which is small. Consequently, the capacitance value C contributing to the differential impedance between the primary coil L1 and the secondary coil L2 (hereinafter referred to as differential impedance 1-2), the capacitance value C contributing to the differential impedance between the secondary coil L2 and the tertiary coil L3 (hereinafter referred to as differential impedance 2-3), and the capacitance value C contributing to the differential impedance between the tertiary coil L3 and the primary coil L1 (hereinafter referred to as differential impedance 3-1) are close to each other. As a result, the differential impedance 1-2, the differential impedance 2-3, and the differential impedance 3-1 are close to each other to reduce the difference.

With the electronic component 10, the length of the current path of the primary coil L1, the length of the current path of the secondary coil L2, and the length of the current path of the tertiary coil L3 are substantially equal to each other, as described above. In addition, the cross-sectional area of the primary coil L1, the cross-sectional area of the secondary coil L2, and the cross-sectional area of the tertiary coil L3 are substantially equal to each other. As a result, the resistance value of the primary coil L1, the resistance value of the secondary coil L2, and the resistance value of the tertiary coil L3 are substantially equal to each other. Accordingly, it is possible to bring the amounts of current flowing through the primary coil L1 to tertiary coil L3 close to each other and to bring the amounts of heat generated by the primary coil L1 to the tertiary coil L3 close to each other. In other words, it is possible to reduce the difference in loss between the signals.

The directionality of the electronic component 10 is lost when the resistance value of the primary coil L1, the resistance value of the secondary coil L2, and the resistance value of the tertiary coil L3 are substantially equal to each other. The outer electrodes 14a to 14c may be used as the input terminals and the outer electrodes 14d to 14f may be used as the output terminals. Alternatively, the outer electrodes 14a to 14c may be used as the output terminals and the outer electrodes 14d to 14f may be used as the input terminals. As a result, it is not necessary to identify the direction of the electronic component 10 in mounting and a direction identification mark is not required. Since the primary coil L1, the secondary coil L2, and the tertiary coil L3 have substantially the same characteristics, the three signals may be input into any of the primary coil L1, the secondary coil L2, and the tertiary coil L3. Consequently, the wiring layout on a circuit board on which the electronic component 10 is mounted is not limited by the electronic component 10.

With the electronic component 10, the amount of heat generated by the coil conductor layer 30a is capable of being close to the amount of heat generated by the series coil conductor layer 36. More specifically, the cross-sectional area of the coil conductor layer 30a is substantially equal to the cross-sectional area of the series coil conductor layer 36. In addition, the length (number of turns) of the coil conductor layer 30a is substantially equal to the length (number of turns) of the series coil conductor layer 36. Accordingly, the resistance value of the coil conductor layer 30a is substantially equal to the resistance value of the series coil conductor layer 36. Since the coil conductor layer 30a is electrically connected in series to the series coil conductor layer 36, the current flowing through the coil conductor layer 30a is substantially equal to the current flowing through the series coil conductor layer 36 and the voltage applied to the coil conductor layer 30a is also substantially equal to the voltage applied to the series coil conductor layer 36. Accordingly, the amount of heat generated by the coil conductor layer 30a is capable of being close to the amount of heat generated by the series coil conductor layer 36.

Furthermore, the thickness of the coil conductor layer 30a, the thickness of the coil conductor layer 32a, the thickness of the coil conductor layer 34a, and the thickness of the series coil conductor layer 36 are substantially equal to each other in the electronic component 10. Accordingly, the coil conductor layers 30a, 32a, and 34a and the series coil conductor layer 36 are capable of being formed under substantially the same forming condition. As a result, it is possible to easily manufacture the electronic component 10.

Figure 5:
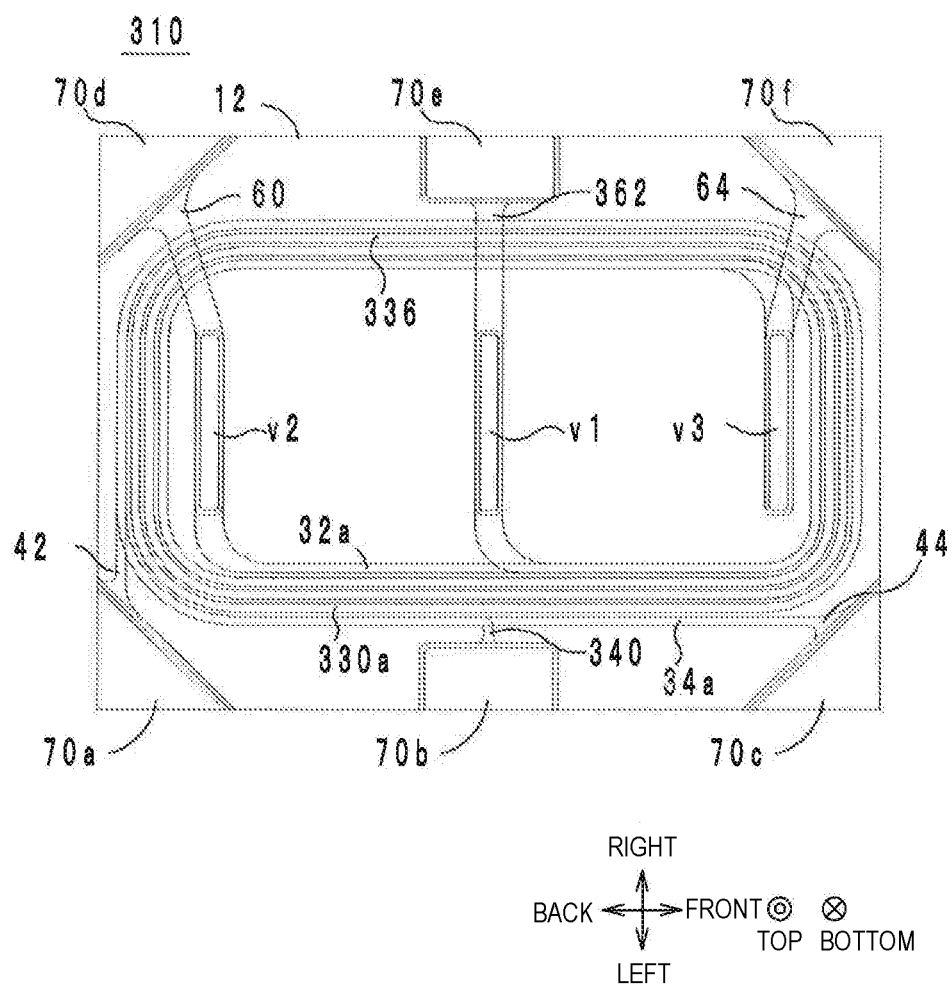
FIG. 5 is a perspective view of an electronic component according to a comparative example, viewed from the upper side.

The inventor of the present application performed computer simulation described below in order to indicate that the difference between the differential impedance 1-2, the differential impedance 2-3, and the differential impedance 3-1 is reduced in the electronic component 10. FIG. 5 is a perspective view of an electronic component 310 according to a comparative example, viewed from the upper side. A coil conductor layer 330a, the coil conductor layers 32a and 34a, an extended conductor layer 340, the extended conductor layers 42, 44, 60, and 64, an extended conductor layer 362, the connection conductors 70a to 70f, and the interlayer connection conductors v1 to v3 are illustrated in FIG.

5. The same reference numerals are used in the electronic component 310 to identify the same components in the electronic component 10.

The inventor of the present application made a model having the same structure as that of the electronic component 10 as a first model according to an embodiment. In addition, the inventor of the present application made a model having the same structure as that of the electronic component 310 of the comparative example illustrated in FIG. 5 as a second model according to the comparative example. The electronic component 310 will now be described. The electronic component 310 differs from the electronic component 10 in that the series coil conductor layer 36 is not provided and the coil conductor layer 330a has a length of about four laps. The end portion of the inner periphery side of the coil conductor layer 330a is connected to the connection conductor 70e with the inter-layer connection conductor v1 and the extended conductor layer 362 interposed therebetween.

In the first model and the second model having the above structures, the differential impedance 1-2, the differential impedance 2-3, and the differential impedance 3-1 were calculated. In the calculation, for example, in the calculation of the differential impedance 1-2, the differential signal was supplied to the primary coil L1 and the secondary coil L2 and ground potential was connected to the tertiary coil L3 at about 50Ω for termination.

Figure 6:
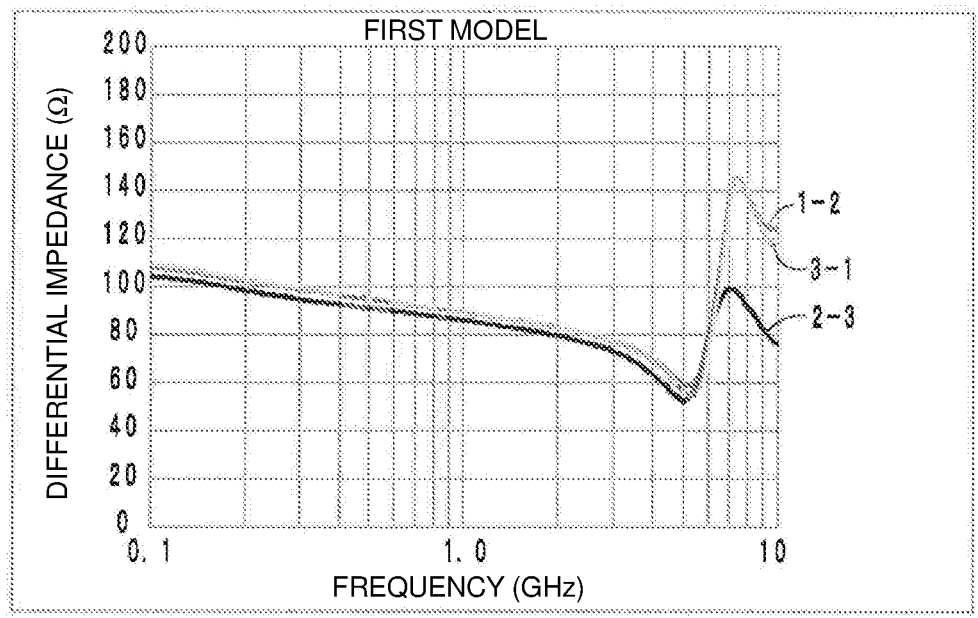
FIG. 6 is a graph illustrating a simulation result of a first model.
Figure 7:
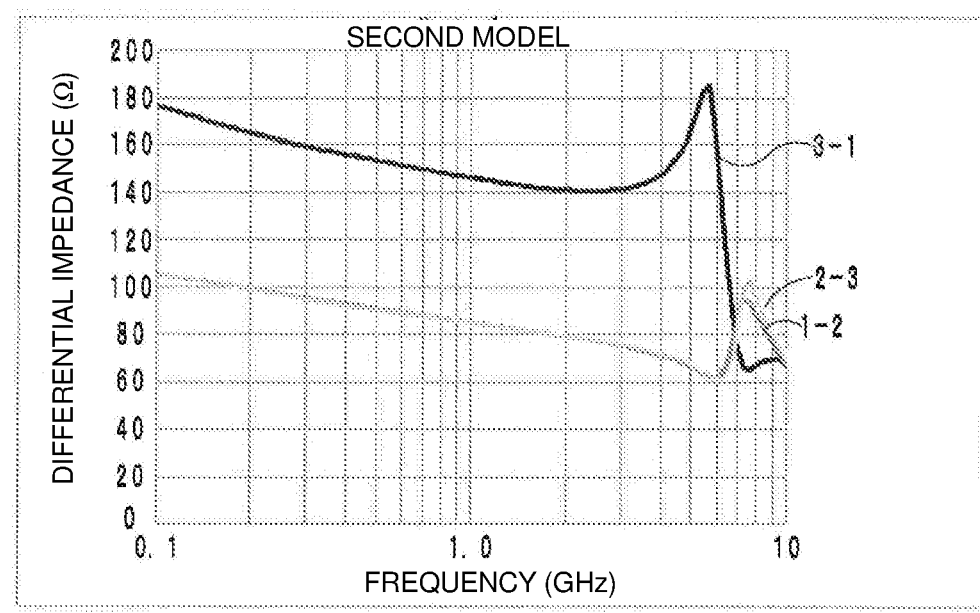
FIG. 7 is a graph illustrating a simulation result of a second model.

FIG. 6 is a graph illustrating a simulation result of the first model. FIG. 7 is a graph illustrating a simulation result of the second model. Referring to FIG. 6 and FIG. 7, the vertical axis represents differential impedance and the horizontal axis represents frequency.

In the second model, the differential impedance 3-1 was greater than the differential impedance 1-2 and the differential impedance 2-3 over a wide band from low frequencies to several gigahertz, as illustrated in FIG. 7.

In contrast, in the first model, the differential impedance 1-2, the differential impedance 2-3, and the differential impedance 3-1 took substantially the same value over a wide band from low frequencies to several gigahertz, as illustrated in FIG. 6. Accordingly, the difference between the differential impedance 1-2, the differential impedance 2-3, and the differential impedance 3-1 was reduced in the electronic component 10.

(First Modification)

Figure 8:
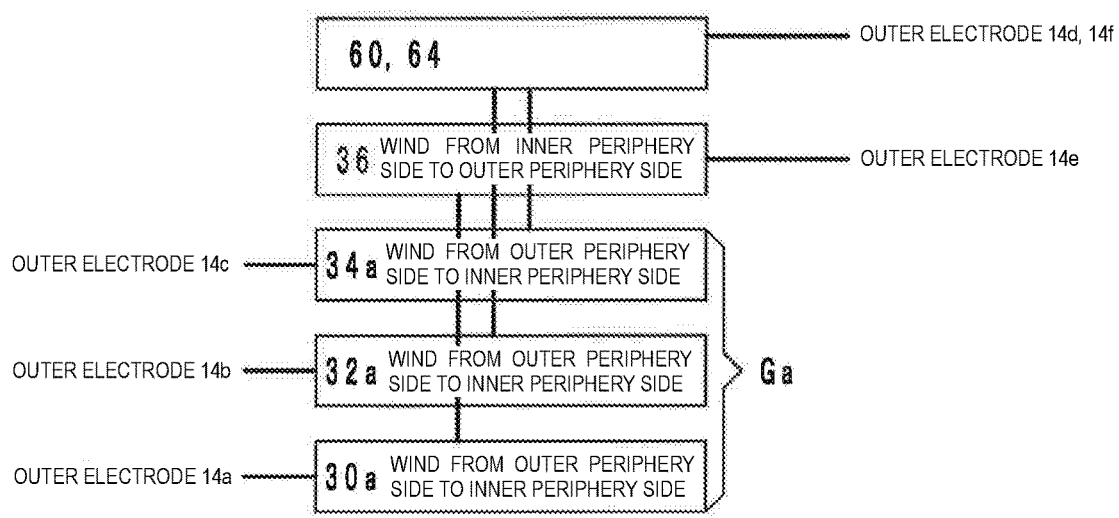
FIG. 8 is a schematic view illustrating the positional relationship between coil conductor layers, a series coil conductor layer, and extended conductor layers in the electronic component in FIG. 1.
Figure 9:
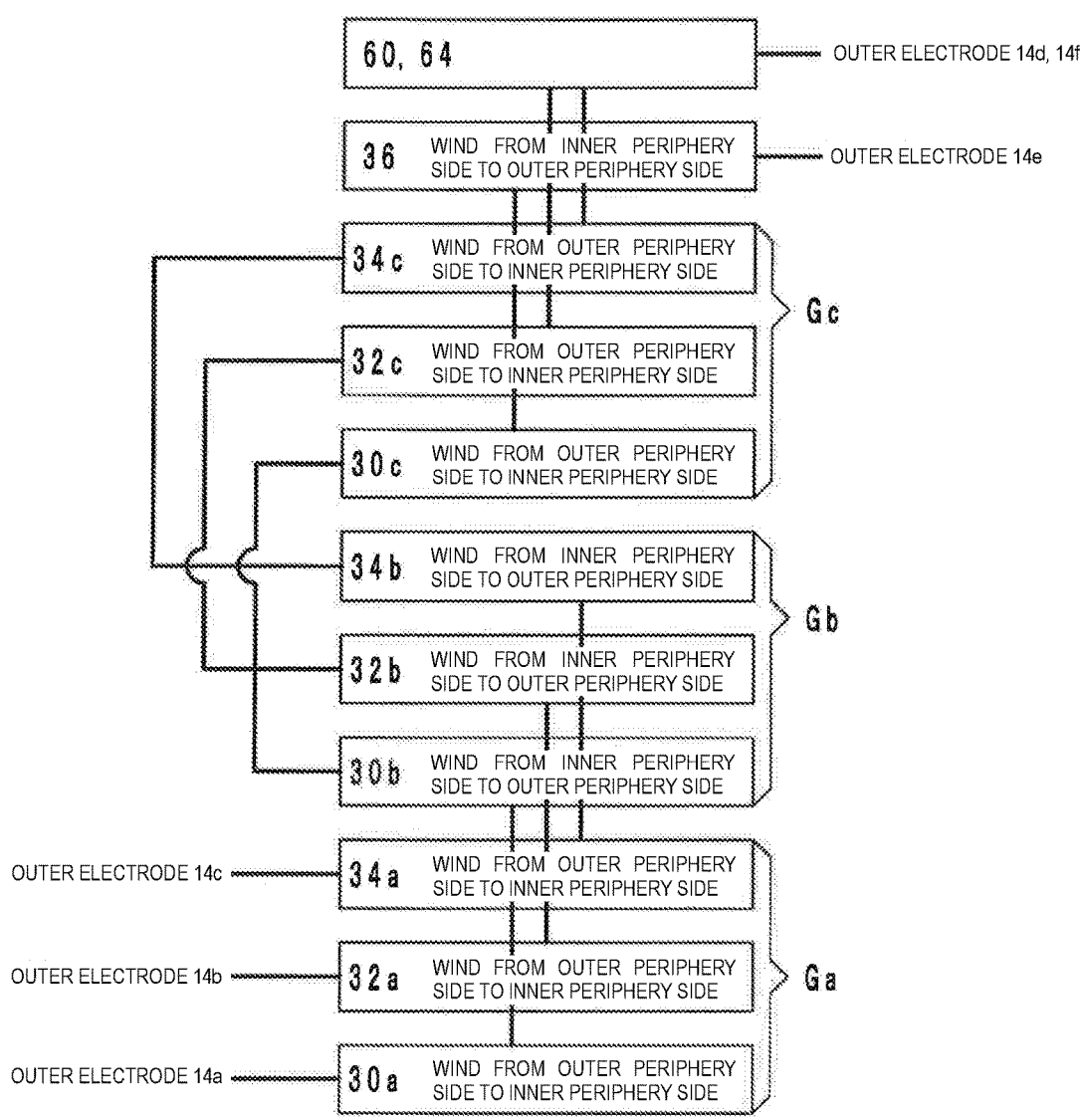
FIG. 9 is a schematic view illustrating the positional relationship between coil conductor layers, a series coil conductor layer, and extended conductor layers in an electronic component according to a first modification.

An exemplary configuration of an electronic component 10a according to a first modification will now be described with reference to the drawings. FIG. 8 is a schematic view illustrating the positional relationship between the coil conductor layers 30a, 32a, and 34a, the series coil conductor layer 36, and the extended conductor layers 60 and 64 in the electronic component 10. FIG. 9 is a schematic view illustrating the positional relationship between the coil conductor layers 30a, 32a, and 34a, coil conductor layers 30b, 32b, 34b, 30c, 32c, and 34c, the series coil conductor layer 36, and the extended conductor layers 60 and 64 in the electronic component 10a.

In the electronic component 10, the primary coil L1 includes one coil conductor layer 30a and one series coil conductor layer 36, the secondary coil L2 includes one coil conductor layer 32a, and the tertiary coil L3 includes one coil conductor layer 34a. In contrast, in the electronic component 10a, the primary coil L1 includes the three coil conductor layers 30a, 30b, and 30c and one series coil conductor layer 36, the secondary coil L2 includes the three coil conductor layers 32a, 32b, and 32c, and the tertiary coil L3 includes the three coil conductor layers 34a, 34b, and 34c. Accordingly, the electronic component 10 differs from the electronic component 10a in the arrangement of the coil conductor layers 30a, 32a, 34a, 30b, 32b, 34b, 30c, 32c, and 34c and the series coil conductor layer 36, as described below.

In the electronic component 10, arrangement of one coil conductor layer 30a, one coil conductor layer 32a, and one coil conductor layer 34a in this order from the lower side to the upper side composes one coil conductor layer group Ga, as illustrated in FIG. 8. The series coil conductor layer 36 is electrically connected in series to the coil conductor layer 30a and is provided at the upper side of the coil conductor layer 34a.

In contrast, in the electronic component 10a, arrangement of one coil conductor layer 30a, one coil conductor layer 32a, and one coil conductor layer 34a in this order from the lower side to the upper side composes one coil conductor layer group Ga, arrangement of one coil conductor layer 30b, one coil conductor layer 32b, and one coil conductor layer 34b in this order from the lower side to the upper side composes one coil conductor layer group Gb, and arrangement of one coil conductor layer 30c, one coil conductor layer 32c, and one coil conductor layer 34c in this order from the lower side to the upper side composes one coil conductor layer group Gc, as illustrated in FIG. 9. The coil conductor layer groups Ga, Gb, and Gc are arranged in this order from the lower side to the upper side. The series coil conductor layer 36 is electrically connected in series to the coil conductor layers 30a to 30c and is provided at the upper side of the coil conductor layer 34c, which is the uppermost coil conductor layer.

Figure 10:
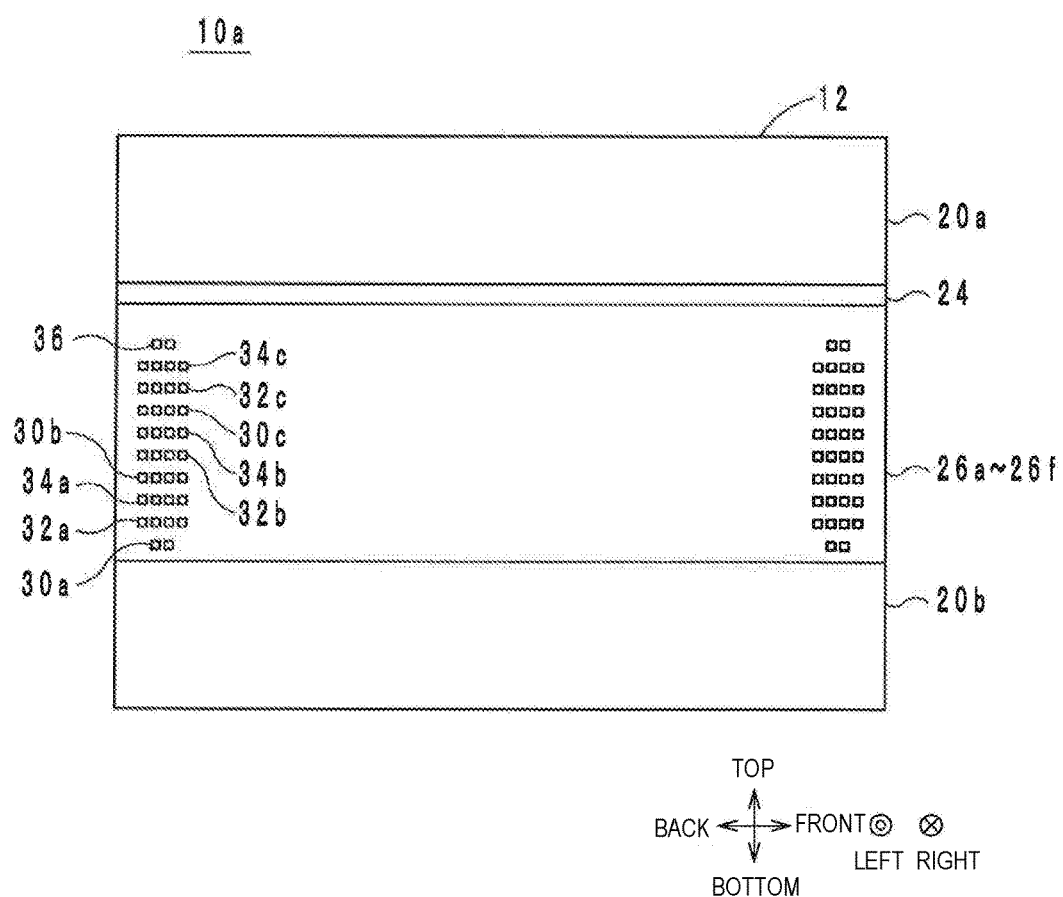
FIG. 10 is a cross-sectional view illustrating an exemplary structure of the electronic component according to the first modification.

An exemplary configuration of the electronic component 10a will now be described in more detail with reference to the drawings. The external perspective view in FIG. 1 is incorporated as the external perspective view of the electronic component 10a. FIG. 10 is a cross-sectional view illustrating an exemplary structure of the electronic component 10a. The cross-sectional structure of the electronic component 10a is illustrated in FIG. 10, taken along line 1-1 in FIG. 1.

Since the outer electrodes 14a to 14f, the connection portions 16a to 16f, the magnetic substrates 20a and 20b, and the magnetic layer 24 in the electronic component 10a are the same as the outer electrodes 14a to 14f, the connection portions 16a to 16f, the magnetic substrates 20a and 20b, and the magnetic layer 24 in the electronic component 10, a description of them in the electronic component 10a is omitted herein.

The coil conductor layers 30a, 32a, and 34a each form a spiral shape in which the coil conductor winds clockwise from the outer periphery side to the inner periphery side, viewed from the upper side. In the first modification, the coil conductor layer 30a (an example of the certain primary coil conductor layer) has a length of about two laps. The coil conductor layers 32a and 34a each have a length of about four laps.

The coil conductor layers 30b, 32b, and 34b each form a spiral shape in which the coil conductor winds clockwise from the inner periphery side to the outer periphery side, viewed from the upper side. In the first modification, the coil conductor layers 30b, 32b, and 34b each have a length of about four laps.

The end portion of the inner periphery side of the coil conductor layer 30a is connected to the end portion of the inner periphery side of the coil conductor layer 30b with an inter-layer connection conductor (not illustrated) interposed therebetween. The end portion of the inner periphery side of the coil conductor layer 32a is connected to the end portion of the inner periphery side of the coil conductor layer 32b with an inter-layer connection conductor (not illustrated) interposed therebetween. The end portion of the inner periphery side of the coil conductor layer 34a is connected to the end portion of the inner periphery side of the coil conductor layer 34b with an inter-layer connection conductor (not illustrated) interposed therebetween.

The coil conductor layers 30c, 32c, and 34c each form a spiral shape in which the coil conductor winds clockwise from the outer periphery side to the inner periphery side, viewed from the upper side. In the first modification, the coil conductor layers 30c, 32c, and 34c each have a length of about four laps.

The end portion of the outer periphery side of the coil conductor layer 30b is connected to the end portion of the outer periphery side of the coil conductor layer 30c with an inter-layer connection conductor (not illustrated) interposed therebetween. The end portion of the outer periphery side of the coil conductor layer 32b is connected to the end portion of the outer periphery side of the coil conductor layer 32c with an inter-layer connection conductor (not illustrated) interposed therebetween. The end portion of the outer periphery side of the coil conductor layer 34b is connected to the end portion of the outer periphery side of the coil conductor layer 34c with an inter-layer connection conductor (not illustrated) interposed therebetween. In addition, the end portion of the inner periphery side of the coil conductor layer 30c is connected to the end portion of the inner periphery side of the series coil conductor layer 36 with an inter-layer connection conductor (not illustrated) interposed therebetween.

With the above configuration, the coil conductor layers 30a, 30b, and 30c and the series coil conductor layer 36 are arranged in this order from the upper side to the lower side and are electrically connected to each other in this order. The coil conductor layers 32a, 32b, 32c are arranged in this order from the upper side to the lower side and are electrically connected to each other in this order. The coil conductor layers 34a, 34b, and 34c are arranged in this order from the upper side to the lower side and are electrically connected to each other in this order.

The end portion of the outer periphery side of the series coil conductor layer 36 is electrically connected to the outer electrode 14e via a connection portion (not illustrated) having the same structure as that of the extended portion 53. The end portion of the inner periphery side of the coil conductor layer 32c is electrically connected to the outer electrode 14d via a connection portion (only the extended conductor layer 60 is illustrated in FIG. 8) having the same structure as that of the extended portion 54. The end portion of the inner periphery side of the coil conductor layer 34c is electrically connected to the outer electrode 14f via a connection portion (only the extended conductor layer 64 is illustrated in FIG. 8) having the same structure as that of the extended portion 55.

The cross-sectional areas of the coil conductor layers 30a, 30b, and 30c, the cross-sectional area of the series coil conductor layer 36, the cross-sectional areas of the coil conductor layers 32a, 32b, and 32c, and the cross-sectional areas of the coil conductor layers 34a, 34b, and 34c are substantially equal to each other. In addition, the vertical spacings between adjacent coil conductor layers, among the coil conductor layers 30a, 30b, 30c, 32a, 32b, 32c, 34a, 34b, and 34c and the series coil conductor layer 36, are substantially equal to each other.

The sum of the number of turns (two laps) of the series coil conductor layer 36 and the number of turns (two laps) of the coil conductor layer 30a (an example of the certain primary coil conductor layer) in the three coil conductor layers 30a to 30c is substantially equal to the number of turns (four laps) of the coil conductor layers 30b and 30c, resulting from exclusion of the coil conductor layer 30a from the three coil conductor layers 30a to 30c.

Also in the electronic component 10a having the above configuration, the same effects and advantages as those of the electronic component 10 are achieved.

In the electronic component 10a, high inductance values are achieved in the primary coil L1, the secondary coil L2, and the tertiary coil L3 for the following reason. This will be described, taking the primary coil L1 as an example. The primary coil L1 has a structure in which the coil conductor layers 30a, 30b, and 30c and the series coil conductor layer 36 are electrically connected in series to each other. Accordingly, the primary coil L1 in the electronic component 10a has an inductance value higher than that of the primary coil L1 in the electronic component 10. The secondary coil L2 and the tertiary coil L3 in the electronic component 10a have inductance values higher than those of the secondary coil L2 and the tertiary coil L3 in the electronic component 10, respectively, for the same reason.

Although the electronic component 10a includes the three coil conductor layer groups Ga, Gb, and Gc, the electronic component 10a may include two coil conductor layer groups or four or more coil conductor layer groups. A case will now be described in which the electronic component 10a includes n-number (n is a natural number) coil conductor layer groups Ga, Gb, . . . .

When the electronic component 10a includes the n-number coil conductor layer groups, the primary coil L1 includes n-number coil conductor layers 30a, 30b, . . . each having a spiral shape and the series coil conductor layer 36 having a spiral shape. The secondary coil L2 includes n-number coil conductor layers 32a, 32b, . . . each having a spiral shape. The tertiary coil L3 includes n-number coil conductor layers 34a, 34b, . . . each having a spiral shape. Arrangement of one coil conductor layer 30a, one coil conductor layer 32a, and one coil conductor layer 34a in this order from the lower side to the upper side composes one coil conductor layer group Ga. Arrangement of one coil conductor layer 30b, one coil conductor layer 32b, and one coil conductor layer 34b in this order from the lower side to the upper side composes one coil conductor layer group Gb. The coil conductor layer group Gc and the coil conductor layer groups subsequent to the coil conductor layer group Gc are composed in the same manner as in the coil conductor layer groups Ga and Gb. The n-number coil conductor layer groups Ga, Gb, . . . are arranged in this order from the lower side to the upper side.

The intermediate line between the portion winding at the outermost side of the coil conductor layer 30a (an example of the certain primary coil conductor layer) and the portion winding at the innermost side thereof is at least partially overlapped with the intermediate line between the portion winding at the outermost side of the coil conductor layer 32a (an example of the secondary coil conductor layer adjacent to the certain primary coil conductor layer in the laminating direction) and the portion winding at the innermost side thereof, viewed from the upper side.

The series coil conductor layer 36 is electrically connected in series to the n-number coil conductor layers 30a, 30b, . . . (for example, a coil conductor layer 30* (* is an n-th alphabetic letter). In the first modification, the series coil conductor layer 36 is electrically connected in series to the coil conductor layer 30* (* is an n-th alphabetic letter). In other words, in the electronic component 10a, the n-number coil conductor layers 30a, 30b, . . . and the series coil conductor layer are electrically connected in series to each other in this order. In addition, the series coil conductor layer 36 is provided at the upper side of a coil conductor layer 34*, which is the uppermost coil conductor layer among the n-number coil conductor layers 34a, 34b, . . . .

The electrical connection of the n-number coil conductor layers 30a, 30b, . . . and the series coil conductor layer in series in this order, as described above, advances the current path from the lower side to the upper side and prevents the current path from advancing from the upper side to the lower side. This simplifies the inter-layer connection structure of the n-number coil conductor layers 30a, 30b, . . . and the series coil conductor layer 36.

In addition, the intermediate line between the portion winding at the outermost side of the series coil conductor layer 36 and the portion winding at the innermost side thereof is at least partially overlapped with the intermediate line between the portion winding at the outermost side of the coil conductor layer 34* (an example of the tertiary coil conductor layer closest to the other side of the laminating direction, among an n-number tertiary coil conductor layers) and the portion winding at the innermost side thereof.

The cross-sectional areas of the n-number coil conductor layers 30a, 30b, . . . , the cross-sectional area of the series coil conductor layer 36, the cross-sectional areas of the n-number coil conductor layers 32a, 32b, . . . , and the cross-sectional areas of the n-number coil conductor layers 34a, 34b, . . . are substantially equal to each other. In addition, the vertical spacings between adjacent coil conductor layers, among the n-number coil conductor layers 30a, 30b, . . . , the n-number coil conductor layers 32a, 32b, . . . , the n-number coil conductor layers 34a, 34b, . . . , and the series coil conductor layer 36, are substantially equal to each other.

A case will now be described in which n is an odd number. In this case, the coil conductor layers 30a, 30b, . . . are a first primary coil conductor layer to an n-th primary coil conductor layer, respectively. M-th (m denotes all odd numbers not smaller than one and not greater than n) primary coil conductor layers each form a spiral shape in which the coil conductor winds clockwise from the outer periphery side to the inner periphery side, viewed from the upper side. K-th (k denotes all even numbers not smaller than two and not greater than n−1) primary coil conductor layers and the series coil conductor layer 36 each form a spiral shape in which the coil conductor winds clockwise from the inner periphery side to the outer periphery side, viewed from the upper side. The first primary coil conductor layer to the n-th primary coil conductor layer and the series coil conductor layer are electrically connected in series to each other in this order. The number of turns of the coil conductor layer 30a (the primary coil conductor layer closest to one side of the laminating direction, among the n-number primary coil conductor layers) is substantially equal to the number of turns of the series coil conductor layer 36. In the first modification, the number of turns of the coil conductor layer 30a and the number of turns of the series coil conductor layer 36 are about two laps.

The coil conductor layers 32a, 32b, . . . are a first secondary coil conductor layer to an n-th secondary coil conductor layer, respectively. M-th (m denotes all odd numbers not smaller than one and not greater than n) secondary coil conductor layers each form a spiral shape in which the coil conductor winds clockwise from the outer periphery side to the inner periphery side, viewed from the upper side. K-th (k denotes all even numbers not smaller than two and not greater than n−1) secondary coil conductor layers each form a spiral shape in which the coil conductor winds clockwise from the inner periphery side to the outer periphery side, viewed from the upper side. The first secondary coil conductor layer to the n-th secondary coil conductor layer are electrically connected in series to each other in this order.

The coil conductor layers 34a, 34b, . . . are a first tertiary coil conductor layer to an n-th tertiary coil conductor layer, respectively. M-th (m denotes all odd numbers not smaller than one and not greater than n) tertiary coil conductor layers each form a spiral shape in which the coil conductor winds clockwise from the outer periphery side to the inner periphery side, viewed from the upper side. K-th (k denotes all even numbers not smaller than two and not greater than n−1) tertiary coil conductor layers each form a spiral shape in which the coil conductor winds clockwise from the inner periphery side to the outer periphery side, viewed from the upper side. The first tertiary coil conductor layer to the n-th tertiary coil conductor layer are electrically connected in series to each other in this order.

(Second Modification)

Figure 11:
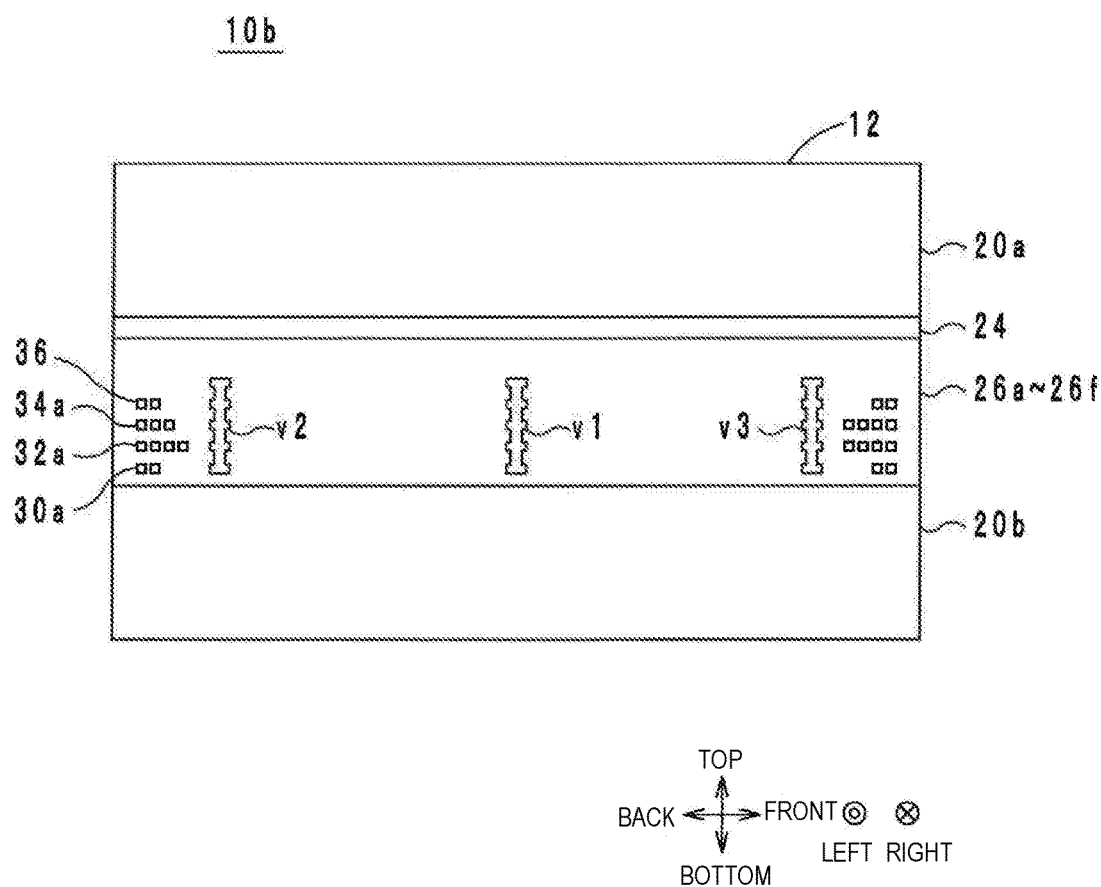
FIG. 11 is a cross-sectional view illustrating an exemplary structure of an electronic component according to a second modification.
Figure 12:
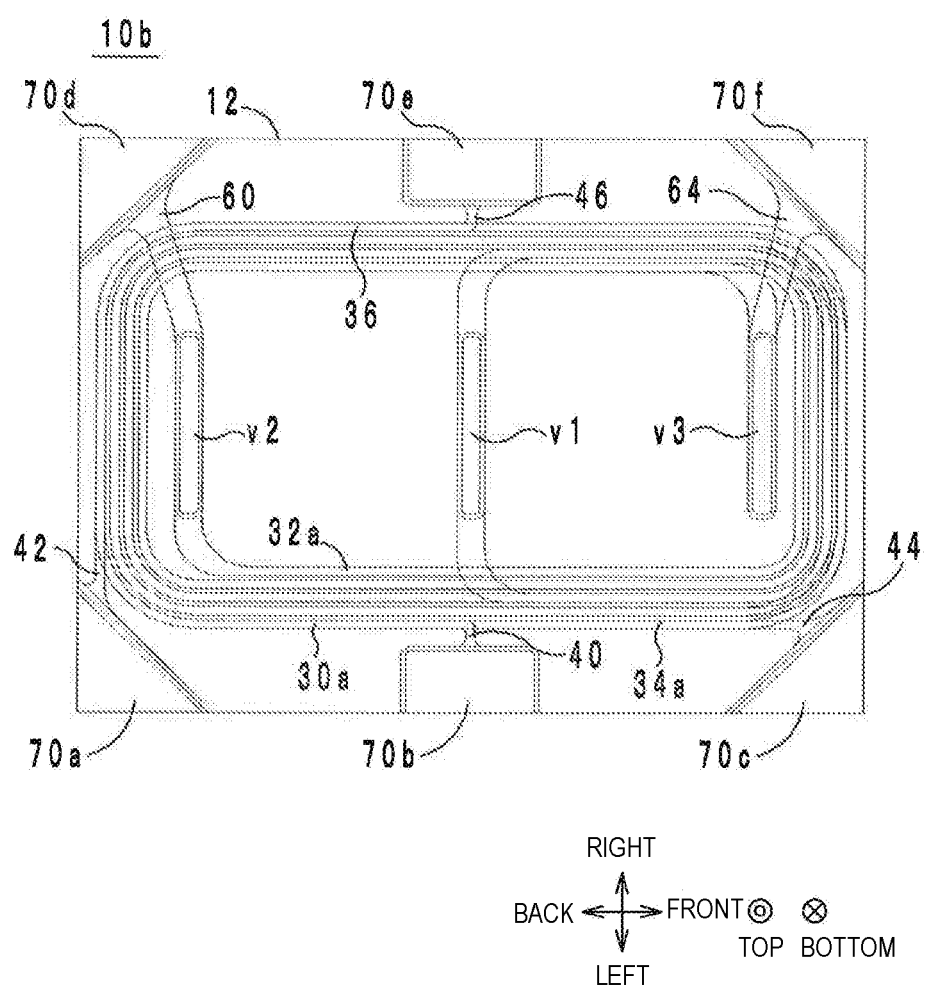
FIG. 12 is a perspective view of the electronic component according to the second modification, viewed from the upper side.

An exemplary configuration of an electronic component 10b according to a second modification will now be described with reference to the drawings. The external perspective view in FIG. 1 is incorporated as the external perspective view of the electronic component 10b because the external perspective view of the electronic component 10b is the same as that of the electronic component 10. FIG. 11 is a cross-sectional view illustrating an exemplary structure of the electronic component 10b. The cross-sectional structure of the electronic component 10b is illustrated in FIG. 11, taken along line 1-1 in FIG. 1. FIG. 12 is a perspective view of the electronic component 10b, viewed from the upper side. The coil conductor layers 30a, 32a, and 34a, the series coil conductor layer 36, the extended conductor layers 40, 42, 44, 46, 60, and 64, the connection conductors 70a to 70f, and the inter-layer connection conductors v1 to v3 are illustrated in FIG. 12.

The electronic component 10b differs from the electronic component 10 in the positional relationship between the coil conductor layer 30a and the coil conductor layer 32a and the positional relationship between the coil conductor layer 34a and the series coil conductor layer 36. The electronic component 10b will now be described, focusing on the above differences.

The coil conductor layer 30a has a length of about two laps. The coil conductor layer 32a has a length of about four laps. The coil conductor layer 32a is overlapped with the coil conductor layer 30a, viewed from the upper side, as illustrated in FIG. 11 and FIG. 12. More specifically, the portion winding at the outermost side of the coil conductor layer 30a is at least partially overlapped with the portion winding at the outermost side of the coil conductor layer 32a (an example of the secondary coil conductor layer adjacent to the primary coil conductor layer in the laminating direction), viewed from the upper side. In the second modification, the coil conductor layer 30a is overlapped with the two laps at the outer periphery side of the coil conductor layer 32a and is not overlapped with the two laps at the inner periphery side of the coil conductor layer 32a.

The coil conductor layer 34a has a length of about four laps. The series coil conductor layer 36 has a length of about two laps. The portion winding at the outermost side of the series coil conductor layer 36 is at least partially overlapped with the portion winding at the outermost side of the coil conductor layer 34a (an example of the tertiary coil conductor layer closest to the second side of the laminating direction), viewed from the upper side. In the second modification, the series coil conductor layer 36 is overlapped with the two laps at the outer periphery side of the coil conductor layer 34a and is not overlapped with the two laps at the inner periphery side of the coil conductor layer 34a.

Also in the electronic component 10b described above, the same effects and advantages as those of the electronic component 10 are achieved. More specifically, with the electronic component 10b, the difference between the differential impedance 1-2, the differential impedance 2-3, and the differential impedance 3-1 is reduced, as in the electronic component 10. With the electronic component 10b, the amounts of heat generated by the primary coil L1 to the tertiary coil L3 are made close to each other, as in the electronic component 10. With the electronic component 10b, it is not necessary to identify the direction of the electronic component 10b in mounting and the direction identification mark is not required, as in the electronic component 10. The wiring layout on a circuit board on which the electronic component 10b is mounted is not limited by the electronic component 10b. With the electronic component 10b, the amount of heat generated by the coil conductor layer 30a is made close to the amount of heat generated by the series coil conductor layer 36. In addition, the electronic component 10b is easily manufactured, as in the electronic component 10.

The inventor of the present application performed computer simulation described below in order to indicate that the difference between the differential impedance 1-2, the differential impedance 2-3, and the differential impedance 3-1 is reduced in the electronic component 10b. The inventor of the present application made a model having the same structure as that of the electronic component 10b as a third model according to an embodiment. In the third model, the differential impedance 1-2, the differential impedance 2-3, and the differential impedance 3-1 were calculated. In the calculation, for example, in the calculation of the differential impedance 1-2, the differential signal was supplied to the primary coil L1 and the secondary coil L2 and the ground potential was connected to the tertiary coil L3 at about 50Ω for termination.

Figure 13:
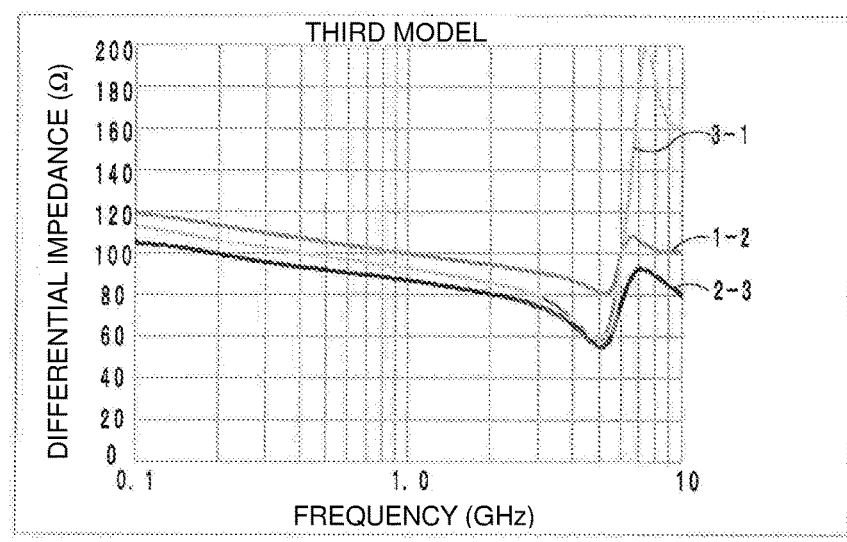
FIG. 13 is a graph illustrating a simulation result of a third model.

FIG. 13 is a graph illustrating a simulation result of the third model. Referring to FIG. 13, the vertical axis represents differential impedance and the horizontal axis represents frequency.

As illustrated in FIG. 13 and FIG. 7, the difference between the differential impedance 1-2, the differential impedance 2-3, and the differential impedance 3-1 was reduced over a wide band from low frequencies to several gigahertz in the third model, compared with the second model. Accordingly, the difference between the differential impedance 1-2, the differential impedance 2-3, and the differential impedance 3-1 was reduced in the electronic component 10b.

A case will now be described in which the electronic component 10b includes the n-number coil conductor layer groups Ga, Gb, . . . , as in the electronic component 10a. The primary coil L1 includes the n-number coil conductor layers 30a, 30b, . . . and the series coil conductor layer 36. The secondary coil L2 includes the n-number coil conductor layers 32a, 32b, . . . . The tertiary coil L3 includes the n-number coil conductor layers 34a, 34b, . . . . Arrangement of one coil conductor layer 30a, one coil conductor layer 32a, and one coil conductor layer 34a in this order from the lower side to the upper side composes one coil conductor layer group Ga. Arrangement of one coil conductor layer 30b, one coil conductor layer 32b, and one coil conductor layer 34b in this order from the lower side to the upper side composes one coil conductor layer group Gb. The coil conductor layer group Gc and the coil conductor layer groups subsequent to the coil conductor layer group Gc are composed in the same manner as in the coil conductor layer groups Ga and Gb. The n-number coil conductor layer groups Ga, Gb, . . . are arranged in this order from the lower side to the upper side.

The series coil conductor layer 36 is electrically connected in series to the n-number coil conductor layers 30a, 30b, . . . . The series coil conductor layer 36 is electrically connected in series to the coil conductor layer 30* (* is an n-th alphabetic letter). Accordingly, in the electronic component 10b, the n-number coil conductor layers 30a, 30b, . . . and the series coil conductor layer 36 are electrically connected in series to each other in this order. In addition, the series coil conductor layer 36 is provided at the upper side of the coil conductor layer 34* (* is an n-th alphabetic letter), which is the uppermost coil conductor layer among the n-number coil conductor layers 34a, 34b, . . . .

The electrical connection of the n-number coil conductor layers 30a, 30b, . . . and the series coil conductor layer in series in this order, as described above, advances the current path from the lower side to the upper side and prevents the current path from advancing from the upper side to the lower side. This simplifies the inter-layer connection structure of the n-number coil conductor layers 30a, 30b, . . . and the series coil conductor layer 36.

The portion winding at the outermost side of the coil conductor layer 30a is at least partially overlapped with the portion winding at the outermost side of the coil conductor layer 32a (an example of the secondary coil conductor layer adjacent to the primary coil conductor layer in the laminating direction), viewed from the upper side. The portion winding at the outermost side of the series coil conductor layer 36 is at least partially overlapped with the portion winding at the outermost side of the coil conductor layer 34* (* is an n-th alphabetic letter) (an example of the tertiary coil conductor layer closest to the one side of the laminating direction, among the n-number tertiary coil conductor layers), viewed from the upper side.

(Third Modification)

Figure 14:
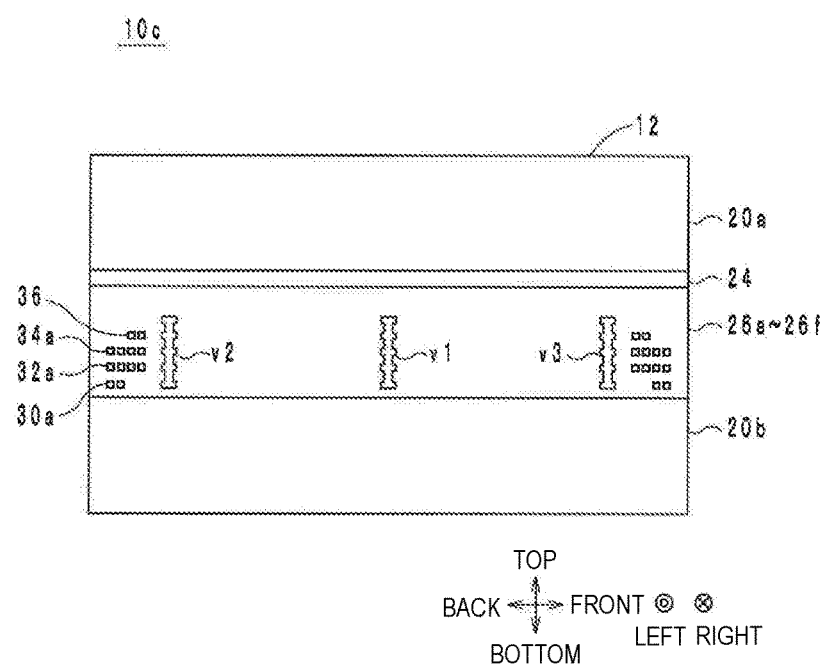
FIG. 14 is a cross-sectional view illustrating an exemplary structure of an electronic component according to a third modification.
Figure 15:
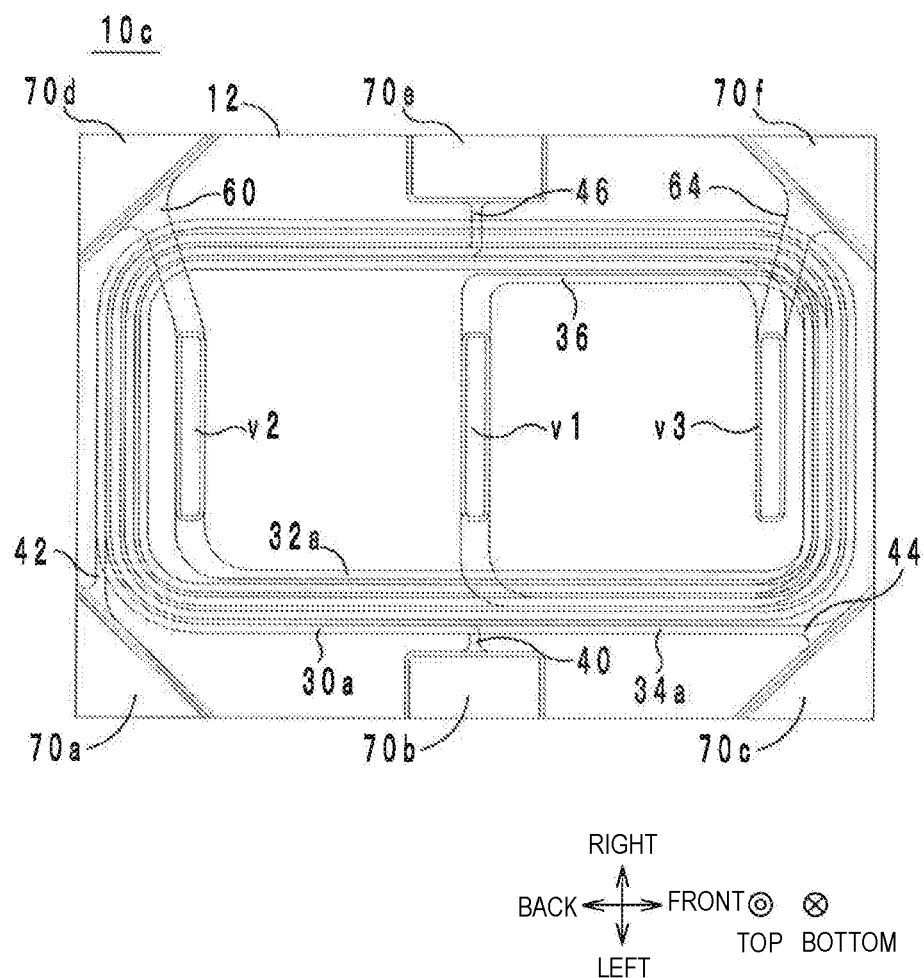
FIG. 15 is a perspective view of the electronic component according to the third modification, viewed from the upper side.

An exemplary configuration of an electronic component 10c according to a third modification will now be described with reference to the drawings. The external perspective view in FIG. 1 is incorporated as the external perspective view of the electronic component 10c because the external perspective view of the electronic component 10c is the same as that of the electronic component 10. FIG. 14 is a cross-sectional view illustrating an exemplary structure of the electronic component 10c. The cross-sectional structure of the electronic component 10c is illustrated in FIG. 11, taken along line 1-1 in FIG. 1. FIG. 15 is a perspective view of the electronic component 10c, viewed from the upper side. The coil conductor layers 30a, 32a, and 34a, the series coil conductor layer 36, the extended conductor layers 40, 42, 44, 46, 60, and 64, the connection conductors 70a to 70f, and the inter-layer connection conductors v1 to v3 are illustrated in FIG. 15.

The electronic component 10c differs from the electronic component 10 in the positional relationship between the coil conductor layer 30a and the coil conductor layer 32a and the positional relationship between the coil conductor layer 34a and the series coil conductor layer 36. The electronic component 10c will now be described, focusing on the above differences.

The coil conductor layer 30a has a length of about two laps. The coil conductor layer 32a has a length of about four laps. The coil conductor layer 32a is overlapped with the coil conductor layer 30a, viewed from the upper side, as illustrated in FIG. 14 and FIG. 15. More specifically, the portion winding at the outermost side of the coil conductor layer 30a is at least partially overlapped with the portion winding at the outermost side of the coil conductor layer 32a (an example of the secondary coil conductor layer adjacent to the primary coil conductor layer in the laminating direction), viewed from the upper side. In the third modification, the coil conductor layer 30a is overlapped with the two laps at the outer periphery side of the coil conductor layer 32a and is not overlapped with the two laps at the inner periphery side of the coil conductor layer 32a.

The coil conductor layer 34a has a length of about four laps. The series coil conductor layer 36 has a length of about two laps. The portion winding at the innermost side of the series coil conductor layer 36 is at least partially overlapped with the portion winding at the innermost side of the coil conductor layer 34a (an example of the tertiary coil conductor layer closest to the second side of the laminating direction), viewed from the upper side. In the third modification, the series coil conductor layer 36 is overlapped with the two laps at the inner periphery side of the coil conductor layer 34a and is not overlapped with the two laps at the outer periphery side of the coil conductor layer 34a.

Also in the electronic component 10c described above, the same effects and advantages as those of the electronic component 10 are achieved. More specifically, with the electronic component 10c, the difference between the differential impedance 1-2, the differential impedance 2-3, and the differential impedance 3-1 is reduced, as in the electronic component 10. With the electronic component 10c, the amounts of heat generated by the primary coil L1 to the tertiary coil L3 are made close to each other, as in the electronic component 10. With the electronic component 10c, it is not necessary to identify the direction of the electronic component 10c in mounting and the direction identification mark is not required, as in the electronic component 10. The wiring layout on a circuit board on which the electronic component 10c is mounted is not limited by the electronic component 10c. With the electronic component 10c, the amount of heat generated by the coil conductor layer 30a is made close to the amount of heat generated by the series coil conductor layer 36. The electronic component 10c is easily manufactured, as in the electronic component 10.

In addition, it is easy to equalize the lengths of the current paths of the primary coil L1 to the tertiary coil L3 in the electronic component 10c. More specifically, the portion winding at the outermost side of the coil conductor layer 30a is at least partially overlapped with the portion winding at the outermost side of the coil conductor layer 32a, viewed from the upper side. The portion winding at the innermost side of the series coil conductor layer 36 is at least partially overlapped with the portion winding at the innermost side of the coil conductor layer 34a, viewed from the upper side. Accordingly, the shape of a combination of the coil conductor layer 30a and the series coil conductor layer 36 is close to the shapes of the coil conductor layers 32a and 34a. As a result, it is easy to equalize the lengths of the current paths of the primary coil L1 to the tertiary coil L3.

The inventor of the present application performed computer simulation described below in order to indicate that the difference between the differential impedance 1-2, the differential impedance 2-3, and the differential impedance 3-1 is reduced in the electronic component 10c. The inventor of the present application made a model having the same structure as that of the electronic component 10c as a fourth model according to an embodiment. In the fourth model, the differential impedance 1-2, the differential impedance 2-3, and the differential impedance 3-1 were calculated. In the calculation, for example, in the calculation of the differential impedance 1-2, the differential signal was supplied to the primary coil L1 and the secondary coil L2 and the ground potential was connected to the tertiary coil L3 at about 50Ω for termination.

Figure 16:
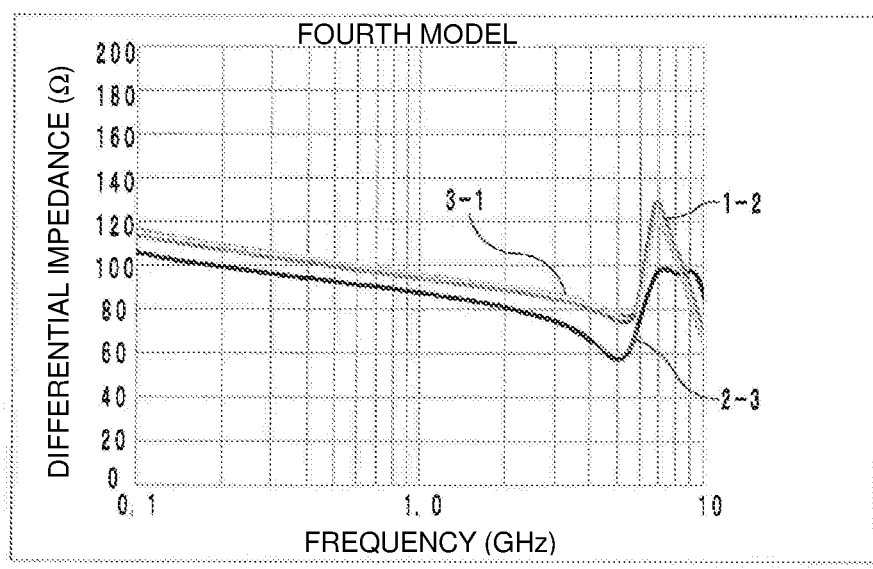
FIG. 16 is a graph illustrating a simulation result of a fourth model.

FIG. 16 is a graph illustrating a simulation result of the fourth model. Referring to FIG. 16, the vertical axis represents differential impedance and the horizontal axis represents frequency.

As illustrated in FIG. 16, the differential impedance 1-2, the differential impedance 2-3, and the differential impedance 3-1 took relatively close values over a wide band from low frequencies to several gigahertz in the fourth model. Accordingly, the difference between the differential impedance 1-2, the differential impedance 2-3, and the differential impedance 3-1 was reduced in the electronic component 10c.

A case will now be described in which the electronic component 10c includes the n-number coil conductor layer groups Ga, Gb, . . . , as in the electronic component 10a. The primary coil L1 includes the n-number coil conductor layers 30a, 30b, . . . and the series coil conductor layer 36. The secondary coil L2 includes the n-number coil conductor layers 32a, 32b, . . . . The tertiary coil L3 includes the n-number coil conductor layers 34a, 34b, . . . . Arrangement of one coil conductor layer 30a, one coil conductor layer 32a, and one coil conductor layer 34a in this order from the lower side to the upper side composes one coil conductor layer group Ga. Arrangement of one coil conductor layer 30b, one coil conductor layer 32b, and one coil conductor layer 34b in this order from the lower side to the upper side composes one coil conductor layer group Gb. The coil conductor layer group Gc and the coil conductor layer groups subsequent to the coil conductor layer group Gc are composed in the same manner as in the coil conductor layer groups Ga and Gb. The n-number coil conductor layer groups Ga, Gb, . . . are arranged in this order from the lower side to the upper side.

The series coil conductor layer 36 is electrically connected in series to the n-number coil conductor layers 30a, 30b, . . . . The series coil conductor layer 36 is provided at the upper side of the coil conductor layer 34* (* is an n-th alphabetic letter), which is the uppermost coil conductor layer among the n-number coil conductor layers 34a, 34b, . . . .

The coil conductor layer 30a (an example of the primary coil conductor layer closest to the one side of the laminating direction, among the n-number primary coil conductor layers) is at least partially overlapped with the portion winding at the outermost side of the coil conductor layer 32a (an example of the secondary coil conductor layer closest to the one side of the laminating direction, among the n-number secondary coil conductor layers) and is not overlapped with the portion winding at the innermost side of the coil conductor layer 32a, viewed from the upper side. In addition, the series coil conductor layer 36 is at least partially overlapped with the portion winding at the innermost side of the coil conductor layer 34* (* is an n-th alphabetic letter) (an example of the tertiary coil conductor layer closest to the one side of the laminating direction, among the n-number tertiary coil conductor layers) and is not overlapped with the portion winding at the outermost side of the coil conductor layer 34*, viewed from the upper side.

In the electronic component 10c, the positional relationship between the coil conductor layer 30a and the series coil conductor layer 36 may be changed. Specifically, the portion winding at the innermost side of the coil conductor layer 30a may be at least partially overlapped with a portion winding at the innermost side of the coil conductor layer 32a (an example of the secondary coil conductor layer adjacent to the primary coil conductor layer in the laminating direction), viewed from the upper side. The portion winding at the outermost side of the series coil conductor layer 36 may be at least partially overlapped with the portion winding at the outermost side of the coil conductor layer 34a (an example of the tertiary coil conductor layer closest to the other side of the laminating direction, among the n-number tertiary coil conductor layers), viewed from the upper side.

(Fourth Modification)

Figure 17:
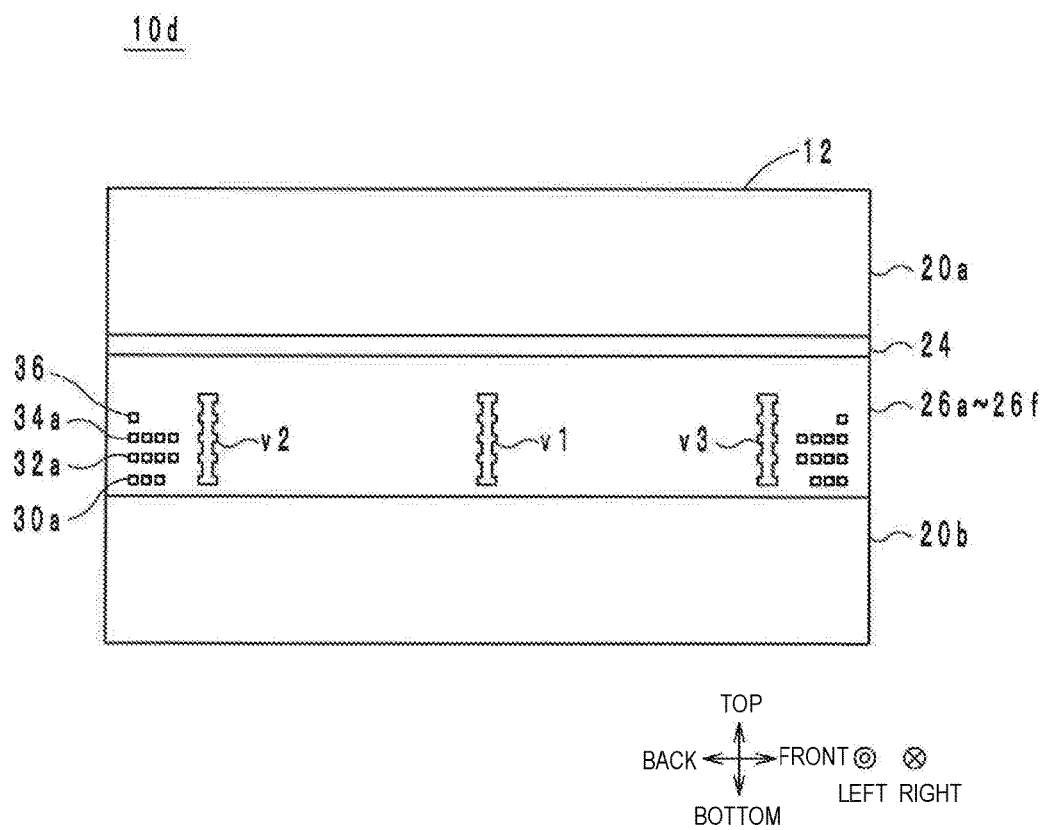
FIG. 17 is a cross-sectional view illustrating an exemplary structure of an electronic component according to a fourth modification.
Figure 18:
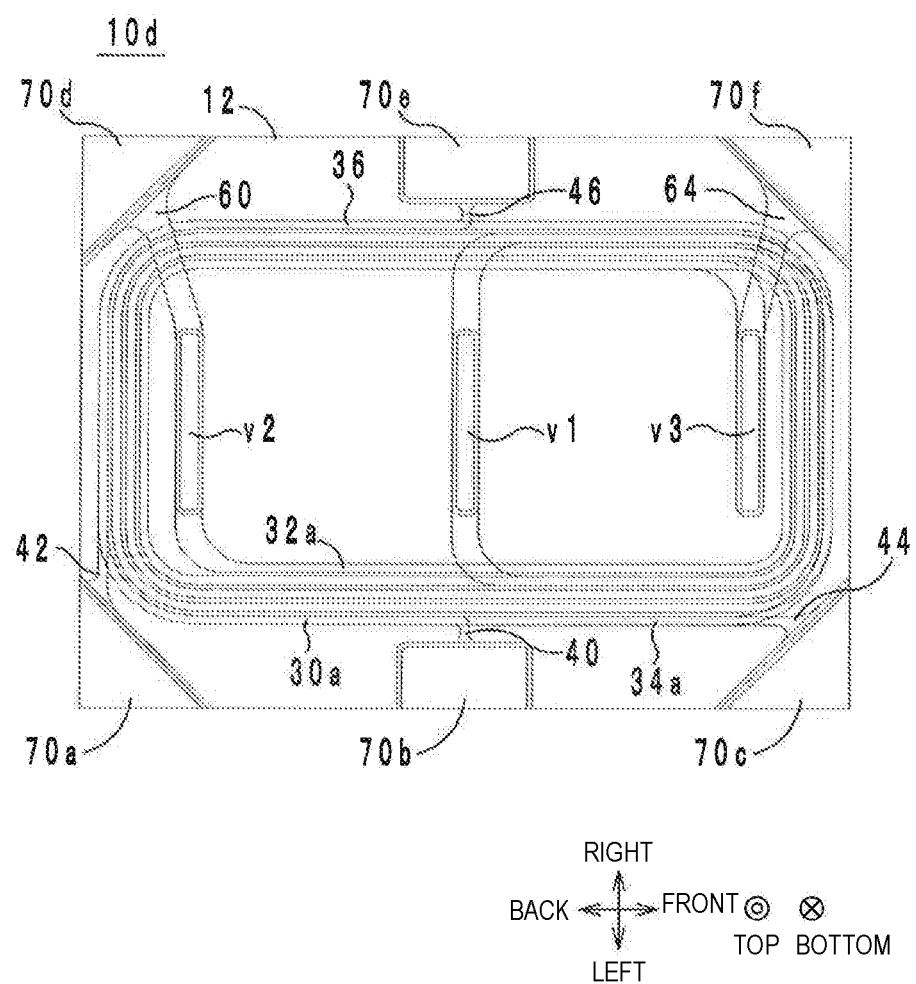
FIG. 18 is a perspective view of the electronic component according to the fourth modification, viewed from the upper side.

An exemplary configuration of an electronic component 10d according to a fourth modification will now be described with reference to the drawings. The external perspective view in FIG. 1 is incorporated as the external perspective view of the electronic component 10d because the external perspective view of the electronic component 10d is the same as that of the electronic component 10. FIG. 17 is a cross-sectional view illustrating an exemplary structure of the electronic component 10d. The cross-sectional structure of the electronic component 10d is illustrated in FIG. 17, taken along line 1-1 in FIG. 1. FIG. 18 is a perspective view of the electronic component 10d, viewed from the upper side. The coil conductor layers 30a, 32a, and 34a, the series coil conductor layer 36, the extended conductor layers 40, 42, 44, 46, 60, and 64, the connection conductors 70a to 70f, and the inter-layer connection conductors v1 to v3 are illustrated in FIG. 18.

The electronic component 10d differs from the electronic component 10 in the positional relationship between the coil conductor layer 30a and the coil conductor layer 32a and the positional relationship between the coil conductor layer 34a and the series coil conductor layer 36. The electronic component 10d will now be described, focusing on the above differences.

The coil conductor layer 30a has a length of about three laps. The coil conductor layer 32a has a length of about four laps. The coil conductor layer 32a is overlapped with the coil conductor layer 30a, viewed from the upper side, as illustrated in FIG. 17 and FIG. 18. More specifically, the portion winding at the outermost side of the coil conductor layer 30a is at least partially overlapped with the portion winding at the outermost side of the coil conductor layer 32a, viewed from the upper side. In the fourth modification, the coil conductor layer 30a is overlapped with the three laps at the outer periphery side of the coil conductor layer 32a and is not overlapped with one lap at the inner periphery side of the coil conductor layer 32a.

The coil conductor layer 34a has a length of about four laps. The series coil conductor layer 36 has a length of about one lap. The portion winding at the outermost side of the series coil conductor layer 36 is at least partially overlapped with the portion winding at the outermost side of the coil conductor layer 34a, viewed from the upper side. In the fourth modification, the series coil conductor layer 36 is overlapped with one lap at the outer periphery side of the coil conductor layer 34a and is not overlapped with the three laps at the inner periphery side of the coil conductor layer 34a.

Also in the electronic component 10d described above, the same effects and advantages as those of the electronic component 10 are achieved. More specifically, with the electronic component 10d, the difference between the differential impedance 1-2, the differential impedance 2-3, and the differential impedance 3-1 is reduced, as in the electronic component 10. With the electronic component 10d, the amounts of heat generated by the primary coil L1 to the tertiary coil L3 are made close to each other, as in the electronic component 10. With the electronic component 10d, it is not necessary to identify the direction of the electronic component 10d in mounting and the direction identification mark is not required, as in the electronic component 10. The wiring layout on a circuit board on which the electronic component 10d is mounted is not limited by the electronic component 10d. With the electronic component 10d, the amount of heat generated by the coil conductor layer 30a is made close to the amount of heat generated by the series coil conductor layer 36. The electronic component 10d is easily manufactured, as in the electronic component 10.

The inventor of the present application performed computer simulation described below in order to indicate that the difference between the differential impedance 1-2, the differential impedance 2-3, and the differential impedance 3-1 is reduced in the electronic component 10d. The inventor of the present application made a model having the same structure as that of the electronic component 10d as a fifth model according to an embodiment. In the fifth model, the differential impedance 1-2, the differential impedance 2-3, and the differential impedance 3-1 were calculated. In the calculation, for example, in the calculation of the differential impedance 1-2, the differential signal was supplied to the primary coil L1 and the secondary coil L2 and the ground potential was connected to the tertiary coil L3 at about 50Ω for termination.

Figure 19:
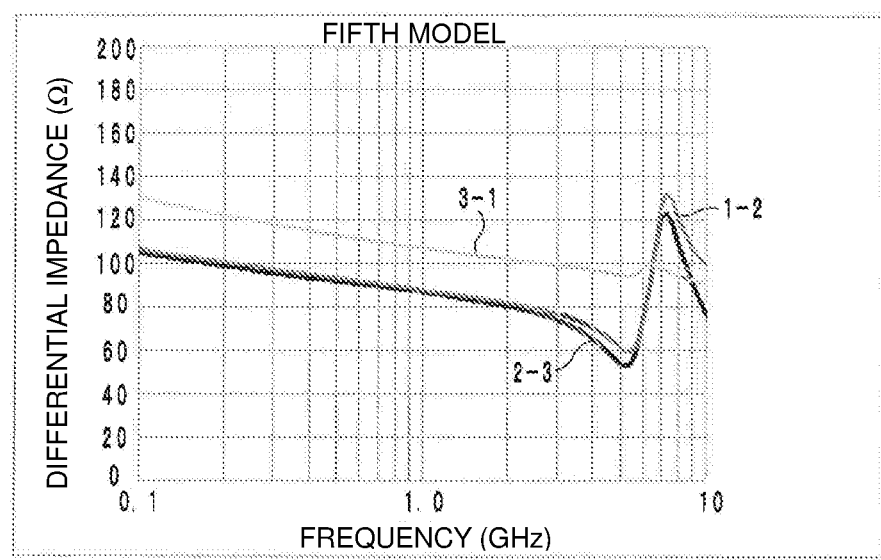
FIG. 19 is a graph illustrating a simulation result of a fifth model.

FIG. 19 is a graph illustrating a simulation result of the fifth model. Referring to FIG. 19, the vertical axis represents differential impedance and the horizontal axis represents frequency.

As illustrated in FIG. 19, the differential impedance 1-2, the differential impedance 2-3, and the differential impedance 3-1 took relatively close values over a wide band from low frequencies to several gigahertz in the fifth model. Accordingly, the difference between the differential impedance 1-2, the differential impedance 2-3, and the differential impedance 3-1 was reduced in the electronic component 10d.

In the fifth model, the series coil conductor layer 36 has a length of only about one lap. Accordingly, the capacitance generated between the coil conductor layer 34a (the tertiary coil L3) and the series coil conductor layer 36 (the primary coil L1) in the fifth model is lower than that in the third model. Consequently, the differential impedance 3-1 in the fifth model is higher than the differential impedance 3-1 in the third model. However, the differential impedance 3-1 in the fifth model is lower than the differential impedance 3-1 in the second model. As a result, the difference between the differential impedance 1-2, the differential impedance 2-3, and the differential impedance 3-1 is reduced in the electronic component 10d. The number of turns of the primary coil conductor layer may be different from that of the series coil conductor layer 36.

(Comparison Between Electronic Components 10, 10b, and 10c)

Figure 20:
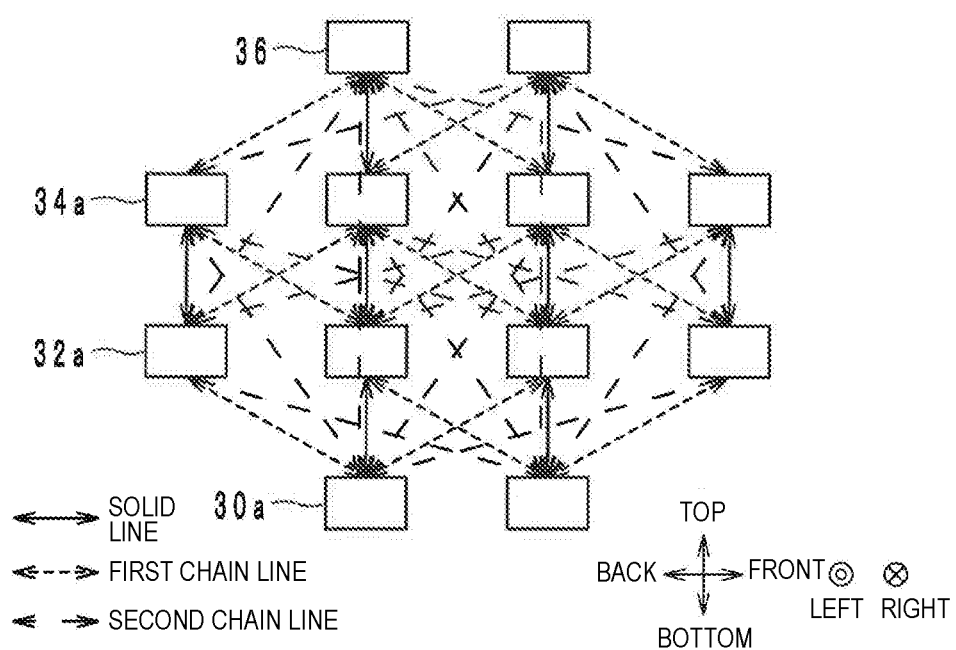
FIG. 20 is a schematic cross-sectional view for describing capacitance generated between the coil conductor layers and the series coil conductor layer in the electronic component in FIG. 1.
Figure 21:
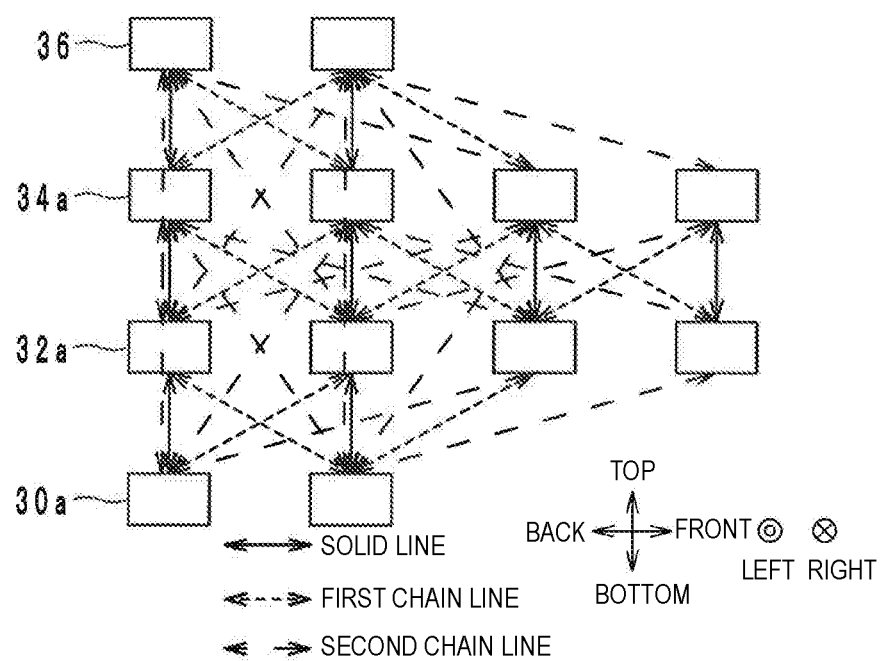
FIG. 21 is a schematic cross-sectional view for describing capacitance generated between the coil conductor layers and the series coil conductor layer in the electronic component according to the second modification.
Figure 22:
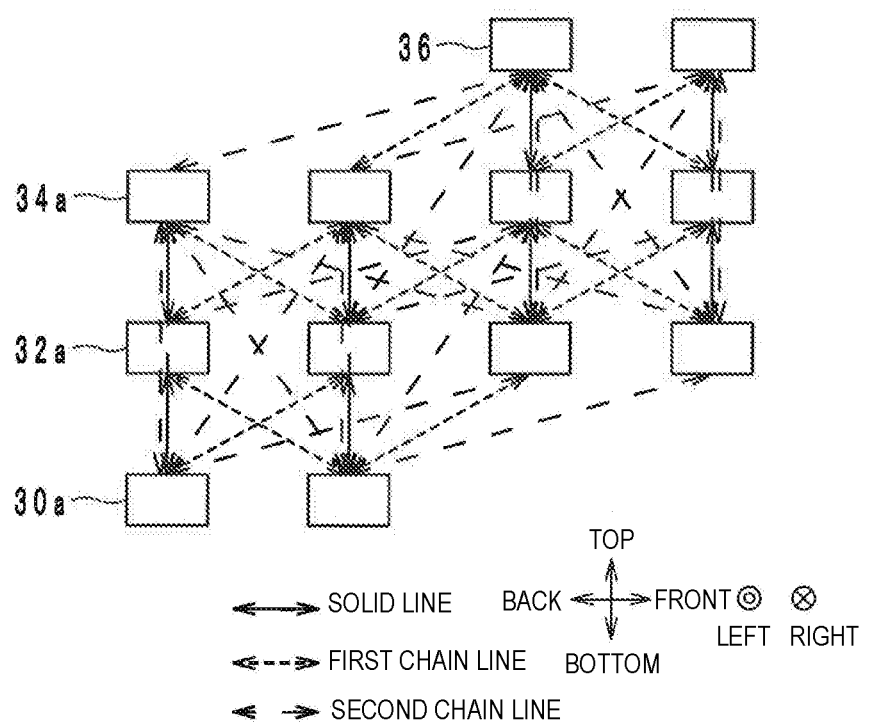
FIG. 22 is a schematic cross-sectional view for describing capacitance generated between the coil conductor layers and the series coil conductor layer in the electronic component according to the third modification.

Characteristics of the electronic components 10, 10b, and 10c will now be compared with each other with reference to FIG. 6, FIG. 7, FIG. 13, and FIG. 16. FIG. 20 is a schematic cross-sectional view for describing the capacitance generated between the coil conductor layers 30a, 32a, and 34a and the series coil conductor layer 36 in the electronic component 10. FIG. 21 is a schematic cross-sectional view for describing the capacitance generated between the coil conductor layers 30a, 32a, and 34a and the series coil conductor layer 36 in the electronic component 10b. FIG. 22 is a schematic cross-sectional view for describing the capacitance generated between the coil conductor layers 30a, 32a, and 34a and the series coil conductor layer 36 in the electronic component 10c. Referring to FIG. 20, FIG. 21, and FIG. 22, each solid line connects two coil conductor layers that are opposed to each other in the vertical direction with one insulating layer interposed therebetween. Each long chain line (hereinafter referred to as a first chain line) connects two coil conductor layers that are adjacent to each other with one insulating layer interposed therebetween and that are adjacent to each other in the front-and-back direction. Each short chain line (hereinafter referred to as a second chain line) connects two coil conductor layers of the following three types. The two coil conductor layers of a first type are opposed to each other in the vertical direction with two insulating layers interposed therebetween. The two coil conductor layers of a second type are adjacent to each other with two insulating layers interposed therebetween and are adjacent to each other in the front-and-back direction. The two coil conductor layers of a third type are adjacent to each other with one insulating layer interposed therebetween and are adjacent to each other in the front-and-back direction with one coil conductor layer interposed therebetween.

The sum of the lengths of the solid lines is shortest, the sum of the lengths of the first chain lines is second shortest, and the sum of the lengths of the second chain lines is third shortest. Accordingly, the capacitance generated between the coil conductor layers connected with the solid lines is highest, the capacitance generated between the coil conductor layers connected with the first chain lines is second highest, and the capacitance generated between the coil conductor layers connected with the second chain lines is third highest. The capacitances generated between the coil conductor layers are increased with the increasing number of the solid lines, the increasing number of the first chain lines, and the increasing number of the second chain lines. The numbers of the solid lines, the first chain lines, and the second chain lines of the electronic component 10, the numbers of the solid lines, the first chain lines, and the second chain lines of the electronic component 10b, and the numbers of the solid lines, the first chain lines, and the second chain lines of the electronic component 10c are illustrated in Table 1, Table 2, and Table 3, respectively.

TABLE 1

Electronic component 10

| | Solid line | First chain line | Second chain line |
|---|---|---|---|
| Between primary coil L1 and secondary coil L2 | 2 | 4 | 8 |
| Between secondary coil L2 and tertiary coil L3 | 4 | 6 | 4 |
| Between tertiary coil L3 and primary coil L1 | 2 | 4 | 8 |

TABLE 2

Electronic component 10b

| | Solid line | First chain line | Second chain line |
|---|---|---|---|
| Between primary coil L1 and secondary coil L2 | 2 | 3 | 7 |
| Between secondary coil L2 and tertiary coil L3 | 4 | 6 | 4 |
| Between tertiary coil L3 and primary coil L1 | 2 | 3 | 7 |

TABLE 3

Electronic component 10c

| | Solid line | First chain line | Second chain line |
|---|---|---|---|
| Between primary coil L1 and secondary coil L2 | 2 | 3 | 7 |
| Between secondary coil L2 and tertiary coil L3 | 4 | 6 | 4 |
| Between tertiary coil L3 and primary coil L1 | 2 | 3 | 7 |

The coil conductor layer 32a opposes the coil conductor layer 34a in the vertical direction with a length of about four laps. The coil conductor layer 30a opposes the coil conductor layer 32a in the vertical direction with a length of about two laps. Accordingly, the capacitance (hereinafter referred to as first capacitance) generated between the coil conductor layer 30a and the coil conductor layer 32a is lower than the capacitance (hereinafter referred to as second capacitance) generated between the coil conductor layer 32a and the coil conductor layer 34a. However, the difference between the first capacitance and the second capacitance in the electronic component 10 is smaller than the differences between the first capacitance and the second capacitance in the electronic components 10b and 10c, as described below.

The numbers of the solid lines connecting the coil conductor layer 30a to the coil conductor layer 32a in the electronic components 10, 10b, and 10c are substantially equal to each other. In contrast, the number of the first chain lines and the number of the second chain lines connecting the coil conductor layer 30a to the coil conductor layer 32a in the electronic component 10 are greater than those in the electronic components 10b and 10c. This is because the coil conductor layer 32a is positioned at only either of the front side and the back side of the coil conductor layer 30a in the electronic components 10b and 10c while the coil conductor layer 32a is positioned at the front side and the back side of the coil conductor layer 30a in the electronic component 10. Accordingly, the second capacitance in the electronic component 10 is higher than the second capacitance in the electronic component 10b and the second capacitance in the electronic component 10c. In other words, the difference between the first capacitance and the second capacitance in the electronic component 10 is smaller than the differences between the first capacitance and the second capacitance in the electronic components 10b and 10c. As a result, the differential impedance 1-2 comes close to the differential impedance 2-3 in the electronic component 10, compared with the differential impedance 1-2 in the electronic components 10b and 10c. The differential impedance 3-1 comes close to the differential impedance 2-3 in the electronic component 10, compared with the differential impedance 3-1 in the electronic components 10b and 10c, for the same reason.

In consideration of the above description, a simulation result (FIG. 6) of the first model of the electronic component 10, a simulation result (FIG. 13) of the third model of the electronic component 10b, and a simulation result (FIG. 16) of the fourth model of the electronic component 10c were compared with each other. As illustrated in FIG. 6, the difference between the three differential impedances was small in a range from low frequencies to a self-resonant point in the first model. In contrast, as illustrated in FIG. 13 and FIG. 16, the differential impedance 1-2 and the differential impedance 3-1 are slightly higher than the differential impedance 2-3 in the range from low frequencies to the self-resonant point in the third and the fourth models. Accordingly, the structure of the electronic component 10 is preferable in order to reduce the difference between the three differential impedances. In other words, the number of turns of the coil conductor layer 30a is half of the number of turns of the coil conductor layer 32a. The intermediate line between the portion winding at the outermost side of the coil conductor layer 30a and the portion winding at the innermost side thereof is preferably at least partially overlapped with the intermediate line between the portion winding at the outermost side of the coil conductor layer 32a and the portion winding at the innermost side thereof, viewed from the upper side. Similarly, the number of turns of the series coil conductor layer 36 is half of the number of turns of the coil conductor layer 34a. The intermediate line between the portion winding at the outermost side of the series coil conductor layer 36 and the portion winding at the innermost side thereof is preferably at least partially overlapped with the intermediate line between the portion winding at the outermost side of the coil conductor layer 34a and the portion winding at the innermost side thereof, viewed from the upper side. As a result, the capacitance generated between the primary coil L1 and the secondary coil L2 and the capacitance generated between the tertiary coil L3 and the primary coil L1 are increased to come close to the capacitance generated between the secondary coil L2 and the tertiary coil L3. Accordingly, the three differential impedances come close to each other.

As illustrated in FIG. 13 and FIG. 16, the difference between the differential impedance 3-1 and the differential impedance 1-2 in the fourth model (the electronic component 10c) was smaller than the difference between the differential impedance 3-1 and the differential impedance 1-2 in the third model (the electronic component 10b) in the range from low frequencies to the self-resonant point. The reason for this will now be described with reference to the drawings.

Figure 23:
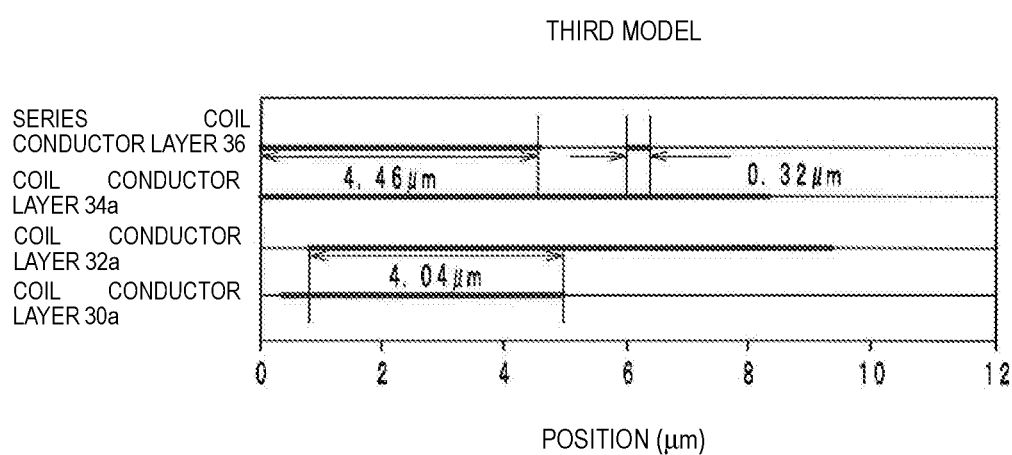
FIG. 23 is a graph illustrating an exemplary arrangement of the coil conductor layers and the series coil conductor layer in the third model.
Figure 24:
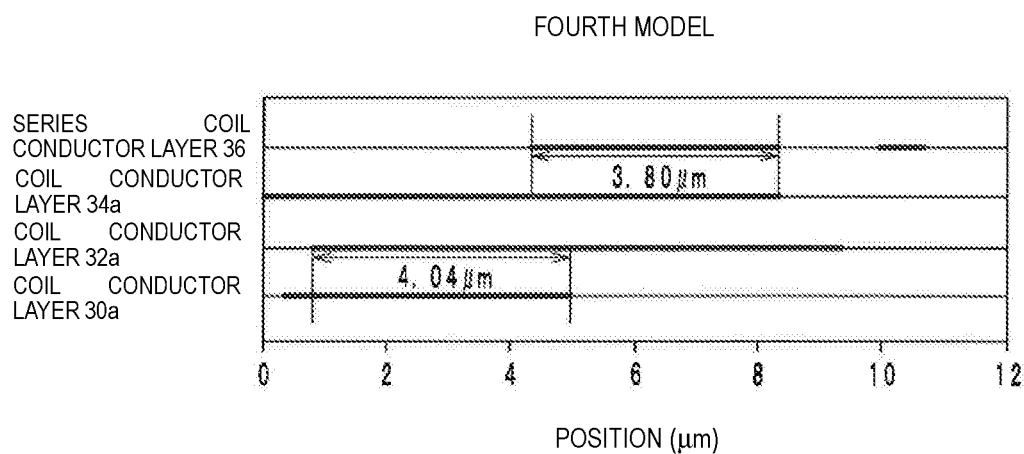
FIG. 24 is a graph illustrating an exemplary arrangement of the coil conductor layers and the series coil conductor layer in the fourth model.

FIG. 23 is a graph illustrating an exemplary arrangement of the coil conductor layers 30a, 32a, and 34a and the series coil conductor layer 36 in the third model. FIG. 24 is a graph illustrating an exemplary arrangement of the coil conductor layers 30a, 32a, and 34a and the series coil conductor layer 36 in the fourth model. Referring to FIG. 23 and FIG. 24, the horizontal axis represents position. The position indicates the distance from the end portion at the outer periphery side of a spiral path formed by the coil conductor layers 32a and 34a. In FIG. 23 and FIG. 24, the coil conductor layers 30a, 32a, and 34a and the series coil conductor layer 36 exist in segments indicated by bold lines.

As illustrated in FIG. 23 and FIG. 24, the length (hereinafter simply referred to as La) at which the coil conductor layer 30a is overlapped with the coil conductor layer 32a is about 4.04 μm in the third model and the fourth model. As illustrated in FIG. 23, the length (hereinafter simply referred to as Lb) at which the coil conductor layer 34a is overlapped with the series coil conductor layer 36 is about 4.78 μm (4.46 μm+0.32 μm) in the third model. As illustrated in FIG. 24, the length Lb at which the coil conductor layer 34a is overlapped with the series coil conductor layer 36 is about 3.80 μm in the fourth model. Accordingly, the absolute value of La-Lb in the third model is about 0.74 μm while the absolute value of La-Lb in the fourth model is about 0.24 μm. Accordingly, the difference between the capacitance generated between the coil conductor layer 34a and the series coil conductor layer 36 and the capacitance generated between the coil conductor layer 30a and the coil conductor layer 32a in the fourth model is smaller than the difference between the capacitance generated between the coil conductor layer 34a and the series coil conductor layer 36 and the capacitance generated between the coil conductor layer 30a and the coil conductor layer 32a in the third model. As a result, as illustrated in FIG. 13 and FIG. 16, the difference between the differential impedance 3-1 and the differential impedance 1-2 in the fourth model is smaller than the difference between the differential impedance 3-1 and the differential impedance 1-2 in the third model. The difference between the differential impedance 3-1 and the differential impedance 1-2 is capable of being adjusted by adjusting the length at which the coil conductor layer 30a is overlapped with the coil conductor layer 32a in the above manner.

(Fifth Modification)

Figure 25:
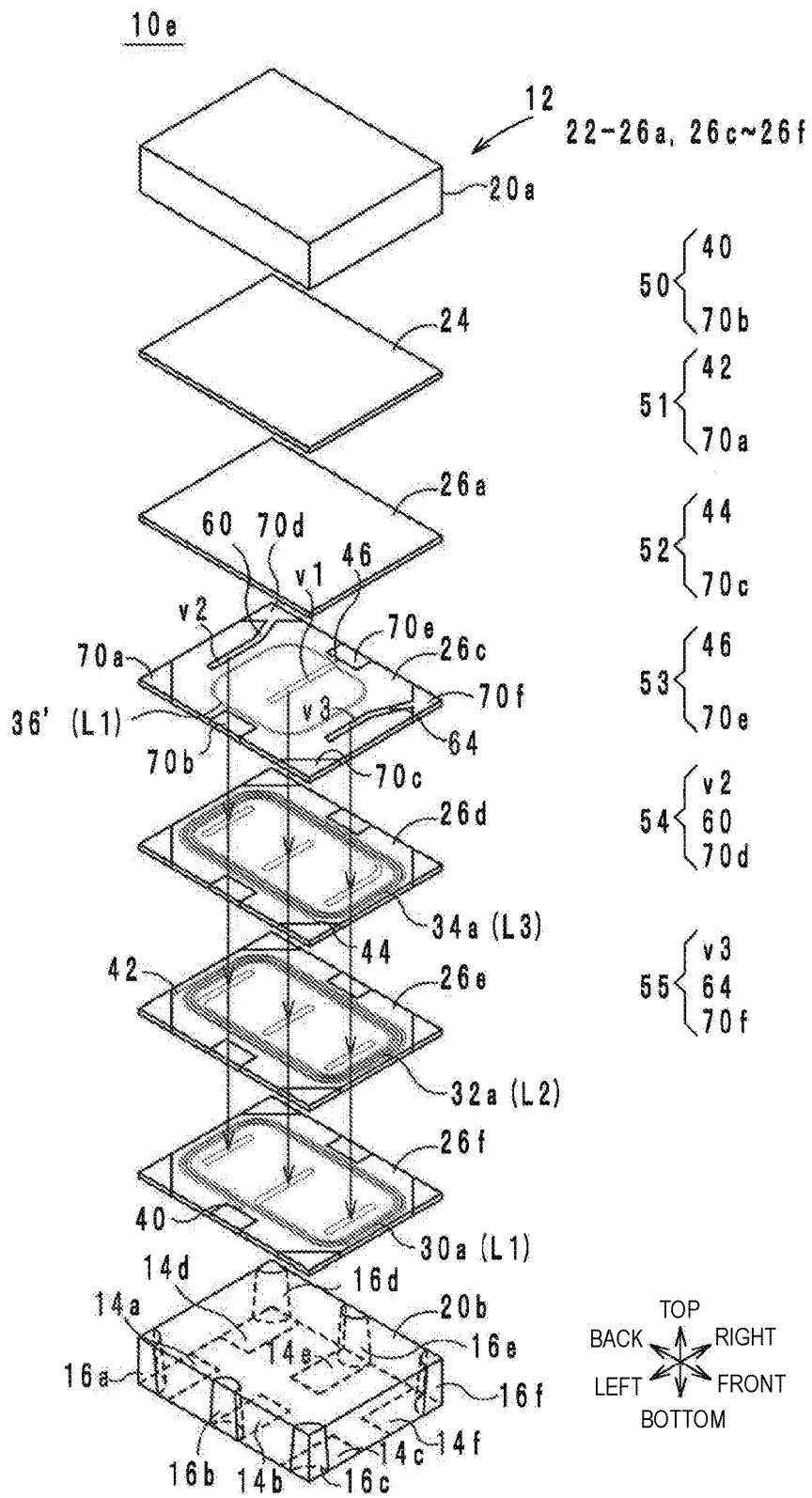
FIG. 25 is an exploded perspective view of an electronic component according to a fifth modification.
Figure 26:
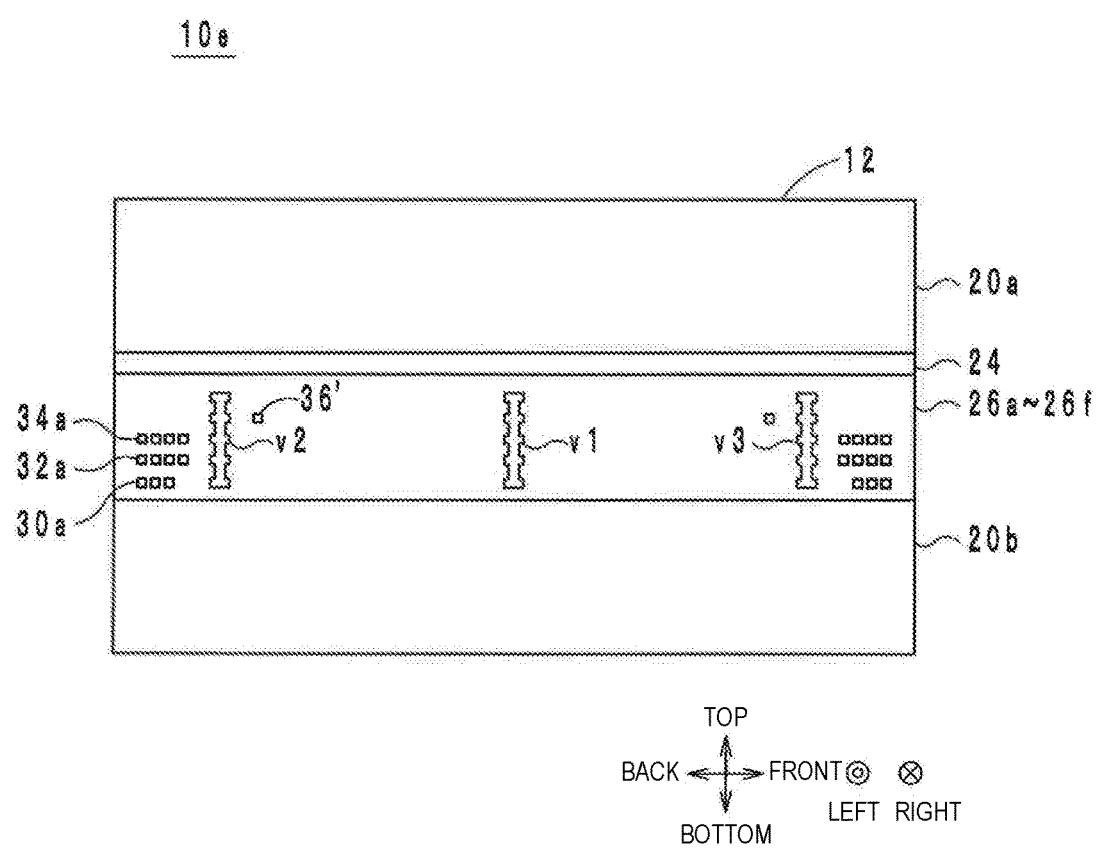
FIG. 26 is a cross-sectional view illustrating an exemplary structure of the electronic component according to the fifth modification.
Figure 27:
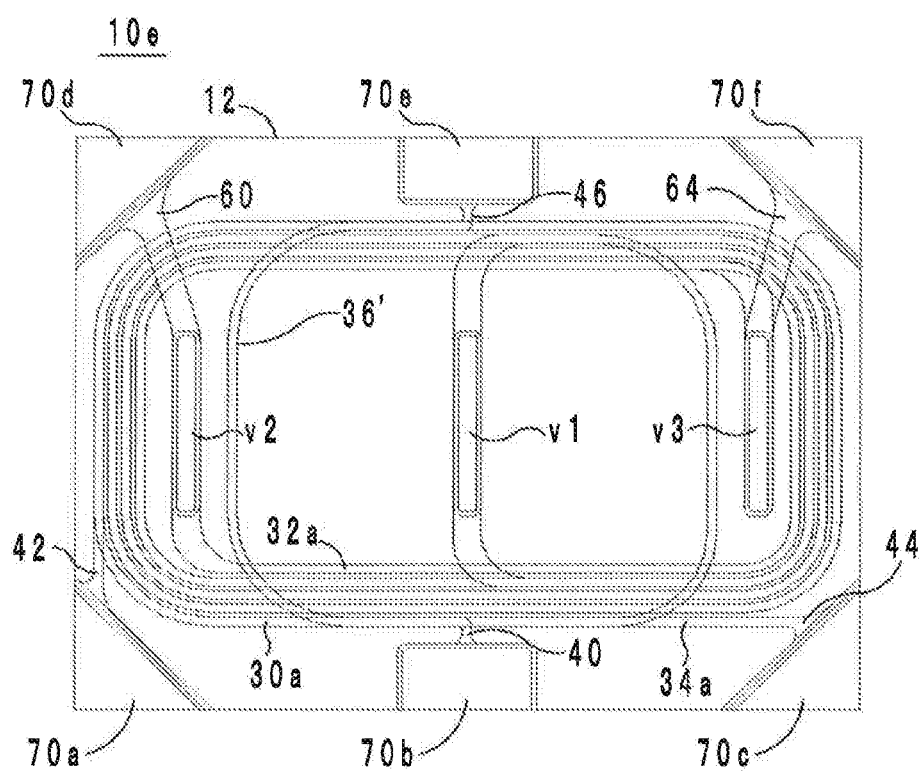
FIG. 27 is a perspective view of the electronic component according to the fifth modification, viewed from the upper side.
Figure 27:
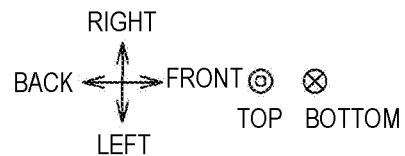

An exemplary configuration of an electronic component 10e according to a fifth modification will now be described with reference to the drawings. The external perspective view in FIG. 1 is incorporated as the external perspective view of the electronic component 10e because the external perspective view of the electronic component 10e is the same as that of the electronic component 10. FIG. 25 is an exploded perspective view of the electronic component 10e. FIG. 26 is a cross-sectional view illustrating an exemplary structure of the electronic component 10e. The cross-sectional structure of the electronic component 10e is illustrated in FIG. 26, taken along line 1-1 in FIG. 1. FIG. 27 is a perspective view of the electronic component 10e, viewed from the upper side. The coil conductor layers 30a, 32a, and 34a, a series coil conductor layer 36', the extended conductor layers 40, 42, 44, 46, 60, and 64, the connection conductors 70a to 70f, and the inter-layer connection conductors v1 to v3 are illustrated in FIG. 27.

The electronic component 10e differs from the electronic component 10 in that the insulating layer 26b is not provided and the extended conductor layers 60 and 64 and the series coil conductor layer 36' are provided on the top face of the insulating layer 26c. The electronic component 10e will now be described, focusing on the above differences.

The coil conductor layer 30a is provided on the top face of the insulating layer 26f and has a spiral shape in which the coil conductor winds clockwise from the outer periphery side to the inner periphery side, viewed from the upper side. In the fifth modification, the coil conductor layer 30a has a length of about three laps. The center of the coil conductor layer 30a substantially coincides with the center (the intersection of diagonal lines) of the electronic component 10e, viewed from the upper side.

The series coil conductor layer 36' is provided at the upper side of the coil conductor layer 34a. More specifically, the series coil conductor layer 36' is provided on the top face of the insulating layer 26c and has a spiral shape in which the coil conductor winds clockwise from the inner periphery side to the outer periphery side, viewed from the upper side. In the fifth modification, the series coil conductor layer 36' has a length of about one lap. The center of the series coil conductor layer 36' substantially coincides with the center (the intersection of diagonal lines) of the electronic component 10e, viewed from the upper side. However, the series coil conductor layer 36' in the electronic component 10e has a shape that is short in the front-and-back direction, compared with the series coil conductor layer 36 in the electronic component 10. Accordingly, the front side and the back side of the series coil conductor layer 36' are not overlapped with the coil conductor layer 34a, viewed from the upper side. The left side and the right side of the series coil conductor layer 36' are overlapped with the outermost part of the coil conductor layer 34a, viewed from the upper side.

The inter-layer connection conductor v1 passes through the insulating layers 26c to 26e in the vertical direction and is provided on the top face of the insulating layer 26f. The inter-layer connection conductor v1 electrically connects the coil conductor layer 30a to the series coil conductor layer 36' in series.

The extended conductor layer 60 (an example of the first extended conductor layer) is provided on the top face of the insulating layer 26c on which the series coil conductor layer 36' is provided. The extended conductor layer 60 is provided outside the series coil conductor layer 36', viewed from the upper side. In the fifth modification, the extended conductor layer 60 is provided at the back side of the series coil conductor layer 36', viewed from the upper side. The shape of the extended conductor layer 60 in the electronic component 10e is the same as that of the extended conductor layer 60 in the electronic component 10.

The extended conductor layer 64 (an example of a second extended conductor layer) is provided on the top face of the insulating layer 26c on which the series coil conductor layer 36' is provided. The extended conductor layer 64 is provided outside the series coil conductor layer 36', viewed from the upper side. In the fifth modification, the extended conductor layer 64 is provided at the front side of the series coil conductor layer 36', viewed from the upper side. The shape of the extended conductor layer 64 in the electronic component 10e is the same as that of the extended conductor layer 64 in the electronic component 10.

The main body 12, the outer electrodes 14a to 14f, the connection portions 16a to 16f, the extended portions 50 to 55, the secondary coil L2, and the tertiary coil L3 in the electronic component 10e have substantially the same structure as those in the electronic component 10. Accordingly, a description of such components is omitted herein.

Also in the electronic component 10e described above, the same effects and advantages as those of the electronic component 10 are achieved. More specifically, with the electronic component 10e, the difference between the differential impedance 1-2, the differential impedance 2-3, and the differential impedance 3-1 is reduced, as in the electronic component 10. With the electronic component 10e, the amounts of heat generated by the primary coil L1 to the tertiary coil L3 are made close to each other, as in the electronic component 10. With the electronic component 10e, it is not necessary to identify the direction of the electronic component 10e in mounting and the direction identification mark is not required, as in the electronic component 10. The wiring layout on a circuit board on which the electronic component 10e is mounted is not limited by the electronic component 10e. With the electronic component 10e, the amount of heat generated by the coil conductor layer 30a is made close to the amount of heat generated by the series coil conductor layer 36'. The electronic component 10e is easily manufactured, as in the electronic component 10.

With the electronic component 10e, the profile is reduced, as described below. More specifically, the extended conductor layers 60 and 64 are provided on the top face of the insulating layer 26c on which the series coil conductor layer 36' is provided. Accordingly, the coil conductor layers 30a, 32a, and 34a, the series coil conductor layer 36, and the extended conductor layers 60 and 64 are capable of being provided on the top faces of the four insulating layers 26c to 26f. As a result, the electronic component 10e is reduced in profile.

The inventor of the present application performed computer simulation described below in order to indicate that the difference between the differential impedance 1-2, the differential impedance 2-3, and the differential impedance 3-1 is reduced in the electronic component 10e. The inventor of the present application made a model having the same structure as that of the electronic component 10e as a sixth model according to an embodiment. In the sixth model, the differential impedance 1-2, the differential impedance 2-3, and the differential impedance 3-1 were calculated. In the calculation, for example, in the calculation of the differential impedance 1-2, the differential signal was supplied to the primary coil L1 and the secondary coil L2 and the ground potential was connected to the tertiary coil L3 at about 50Ω for termination.

Figure 28:
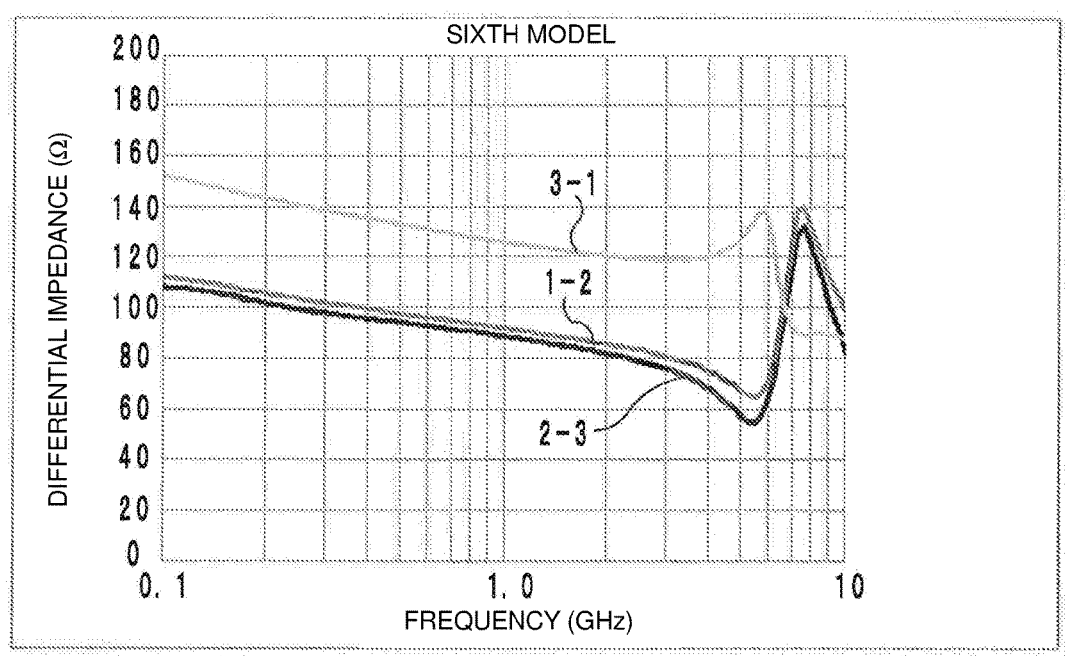
FIG. 28 is a graph illustrating a simulation result of a sixth model.

FIG. 28 is a graph illustrating a simulation result of the sixth model. Referring to FIG. 28, the vertical axis represents differential impedance and the horizontal axis represents frequency.

As illustrated in FIG. 28, the differential impedance 1-2, the differential impedance 2-3, and the differential impedance 3-1 took relatively close values in the range from low frequencies to the self-resonant point in the sixth model. Accordingly, the difference between the differential impedance 1-2, the differential impedance 2-3, and the differential impedance 3-1 was reduced in the electronic component 10e.

In the sixth model, the series coil conductor layer 36' has a length of only about one lap. Accordingly, the capacitance generated between the coil conductor layer 34a (the tertiary coil L3) and the series coil conductor layer 36' (the primary coil L1) in the sixth model is lower than that in the third model. Consequently, the differential impedance 3-1 in the sixth model is higher than the differential impedance 3-1 in the third model. However, the differential impedance 3-1 in the sixth model is lower than the differential impedance 3-1 in the second model. As a result, the difference between the differential impedance 1-2, the differential impedance 2-3, and the differential impedance 3-1 was reduced in the electronic component 10e.

The electronic components 10 and 10a to 10e are generally mounted on circuit boards for usage. In this case, a first signal line is connected to the primary coil L1, a second signal line is connected to the secondary coil L2, and a third signal line is connected to the tertiary coil L3. The differential impedance between the first signal line and the second signal line is referred to as external differential impedance 1-2, the differential impedance between the second signal line and the third signal line is referred to as external differential impedance 2-3, and the differential impedance between the third signal line and the first signal line is referred to as external differential impedance 3-1. The external differential impedance 1-2, the external differential impedance 2-3, and the external differential impedance 3-1 may not substantially be equal to each other depending on the structure of the circuit board. For example, there are cases in which the difference between the external differential impedance 3-1 and the external differential impedance 1-2 and the difference between the external differential impedance 3-1 and the external differential impedance 2-3 are relatively large and in which the differences are relatively small.

When the difference between the external differential impedance 3-1 and the external differential impedance 1-2 and the difference between the external differential impedance 3-1 and the external differential impedance 2-3 are relatively large, the electronic component 10e (the sixth model) is preferably used. Since the differential impedance 3-1 is higher than the differential impedance 1-2 and the differential impedance 2-3 in the electronic component 10e (the sixth model), the differential impedance of the circuit board is easily matched with the differential impedance of the electronic component 10e.

In contrast, when the difference between the external differential impedance 3-1 and the external differential impedance 1-2 and the difference between the external differential impedance 3-1 and the external differential impedance 2-3 are relatively small, the electronic component 10 and the electronic components 10a to 10d are preferably used. Since the difference between the differential impedance 3-1 and the differential impedance 1-2 and the difference between the differential impedance 3-1 and the differential impedance 2-3 are small in the electronic components 10 and the electronic components 10a to 10d, the differential impedance of the circuit board is easily matched with the differential impedance of the electronic component. As described above, the electronic component 10 and the electronic components 10a to 10e may be selected depending on the external differential impedances 1-2, 2-3, and 3-1 of the circuit board.

The electronic component 10e may include n-number (n is a natural number) coil conductor layer groups, as in the electronic component 10a. A case will now be described in which the electronic component 10e includes the n-number coil conductor layer groups Ga, Gb, . . . .

When the electronic component 10e includes the n-number coil conductor layer groups Ga, Gb, . . . , the primary coil L1 includes the n-number coil conductor layers 30a, 30b, . . . each having a spiral shape and the series coil conductor layer 36 having a spiral shape. The secondary coil L2 includes the n-number coil conductor layers 32a, 32b, . . . each having a spiral shape. The tertiary coil L3 includes the n-number coil conductor layers 34a, 34b, . . . each having a spiral shape. Arrangement of one coil conductor layer 30a, one coil conductor layer 32a, and one coil conductor layer 34a in this order from the lower side to the upper side composes one coil conductor layer group Ga. Arrangement of one coil conductor layer 30b, one coil conductor layer 32b, and one coil conductor layer 34b in this order from the lower side to the upper side composes one coil conductor layer group Gb. The coil conductor layer group Gc and the coil conductor layer groups subsequent to the coil conductor layer group Gc are composed in the same manner as in the coil conductor layer groups Ga and Gb. The n-number coil conductor layer groups Ga, Gb, . . . are arranged in this order from the lower side to the upper side.

The series coil conductor layer 36' is electrically connected in series to the n-number coil conductor layers 30a, 30b, . . . . In addition, the series coil conductor layer 36' is provided at the upper side of the coil conductor layer 34* (* is an n-th alphabet letter), which is the uppermost coil conductor layer among the n-number coil conductor layers 34a, 34b, . . . .

A case will now be described in which n is an odd number. In this case, the coil conductor layers 30a, 30b, . . . are a first primary coil conductor layer to an n-th primary coil conductor layer, respectively. M-th (m denotes all odd numbers not smaller than one and not greater than n) primary coil conductor layers each form a spiral shape in which the coil conductor winds clockwise from the outer periphery side to the inner periphery side, viewed from the upper side. K-th (k denotes all even numbers not smaller than two and not greater than n−1) primary coil conductor layers and the series coil conductor layer 36 each form a spiral shape in which the coil conductor winds clockwise from the inner periphery side to the outer periphery side, viewed from the upper side. The first primary coil conductor layer to the n-th primary coil conductor layer and the series coil conductor layer are electrically connected in series to each other in this order.

The coil conductor layers 32a, 32b, . . . are a first secondary coil conductor layer to an n-th secondary coil conductor layer, respectively. M-th (m denotes all odd numbers not smaller than one and not greater than n) secondary coil conductor layers each form a spiral shape in which the coil conductor winds clockwise from the outer periphery side to the inner periphery side, viewed from the upper side. K-th (k denotes all even numbers not smaller than two and not greater than n−1) secondary coil conductor layers each form a spiral shape in which the coil conductor winds clockwise from the inner periphery side to the outer periphery side, viewed from the upper side. The first secondary coil conductor layer to the n-th secondary coil conductor layer are electrically connected in series to each other in this order.

The coil conductor layers 34a, 34b, . . . are a first tertiary coil conductor layer to an n-th tertiary coil conductor layer, respectively. M-th (m denotes all odd numbers not smaller than one and not greater than n) tertiary coil conductor layers each form a spiral shape in which the coil conductor winds clockwise from the outer periphery side to the inner periphery side, viewed from the upper side. K-th (k denotes all even numbers not smaller than two and not greater than n−1) tertiary coil conductor layers each form a spiral shape in which the coil conductor winds clockwise from the inner periphery side to the outer periphery side, viewed from the upper side. The first tertiary coil conductor layer to the n-th tertiary coil conductor layer are electrically connected in series to each other in this order.

The extended conductor layers 60 and 64 are provided on the top face of the insulating layer 26c on which the series coil conductor layer 36' is provided and are provided outside the series coil conductor layer 36', viewed from the upper side.

(Sixth Modification)

Figure 29:
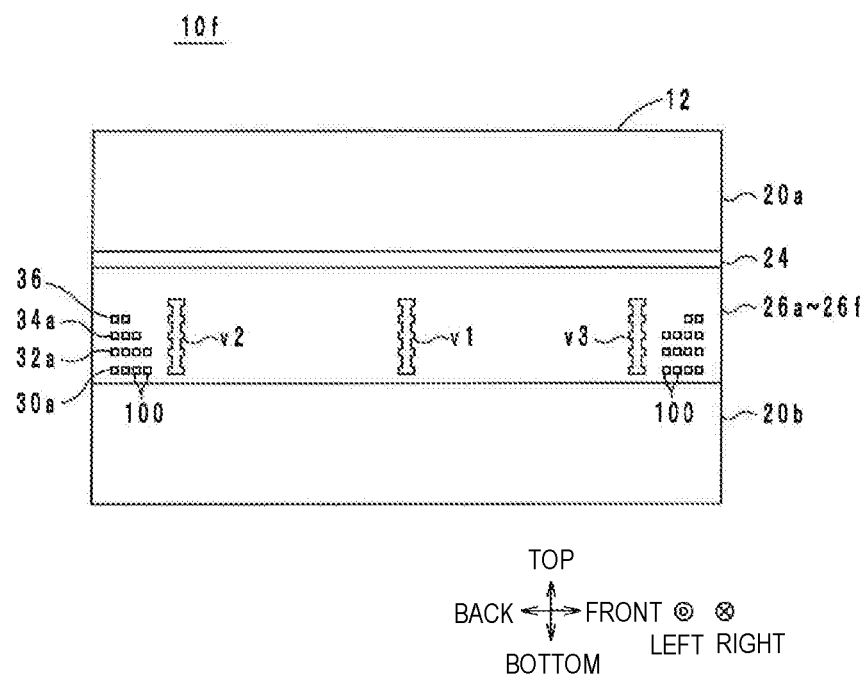
FIG. 29 is a cross-sectional view illustrating an exemplary structure of an electronic component according to a sixth modification.
Figure 30:
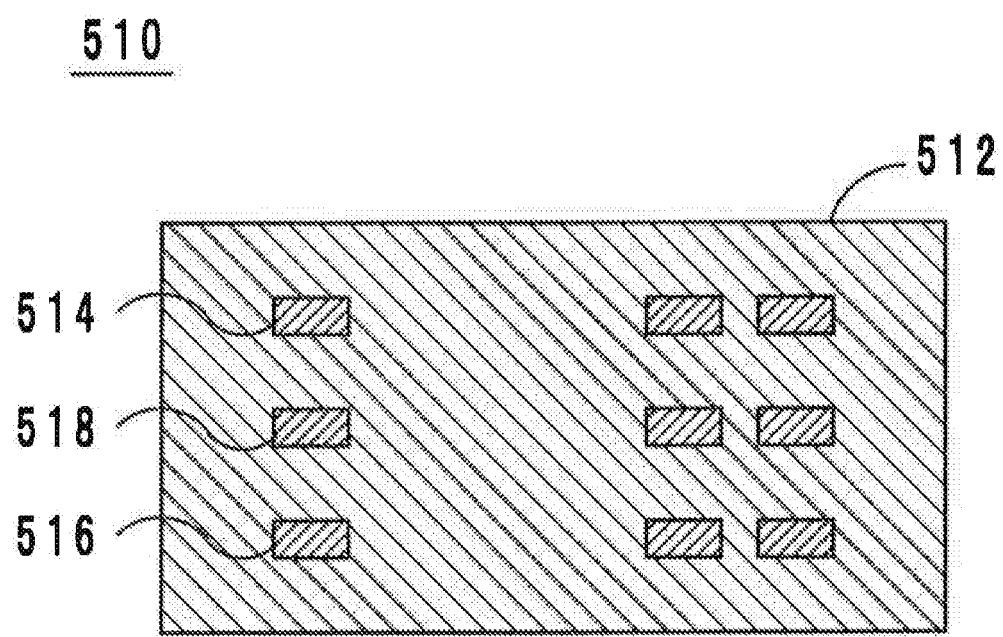
FIG. 30 is a cross-sectional view illustrating an exemplary structure of a common mode choke coil in the related art.

An exemplary configuration of an electronic component 10f according to a sixth modification will now be described with reference to the drawing. The external perspective view in FIG. 1 is incorporated as the external perspective view of the electronic component 10f because the external perspective view of the electronic component 10f is the same as that of the electronic component 10. FIG. 29 is a cross-sectional view illustrating an exemplary structure of the electronic component 10f. The cross-sectional structure of the electronic component 10f is illustrated in FIG. 29, taken along line 1-1 in FIG. 1.

The electronic component 10f differs from the electronic component 10b in that the electronic component 10f includes a dummy conductor layer 100. The electronic component 10f will now be described, focusing on the above difference.

The dummy conductor layer 100 is provided on the top face of the insulating layer 26f on which the coil conductor layer 30a (an example of the certain primary coil conductor layer) is provided. The dummy conductor layer 100 is overlapped with at least part of a portion that is not overlapped with the coil conductor layer 30a in the coil conductor layer 32a adjacent to the coil conductor layer 30a in the vertical direction. In the sixth modification, the dummy conductor layer 100 is overlapped with two laps at the inner periphery side of the coil conductor layer 32a, viewed from the upper side. The dummy conductor layer 100 is not electrically connected to the other conductors (the coil conductor layers 30a, 32a, and 34a and the series coil conductor layer 36). Accordingly, the potential of the dummy conductor layer 100 is a floating potential.

Also in the electronic component 10f described above, the same effects and advantages as those of the electronic component 10b are achieved. More specifically, with the electronic component 10f, the difference between the differential impedance 1-2, the differential impedance 2-3, and the differential impedance 3-1 is reduced, as in the electronic component 10b. With the electronic component 10f, the amounts of heat generated by the primary coil L1 to the tertiary coil L3 are made close to each other, as in the electronic component 10b. With the electronic component 10f, it is not necessary to identify the direction of the electronic component 10f in mounting and the direction identification mark is not required, as in the electronic component 10b. The wiring layout on a circuit board on which the electronic component 10f is mounted is not limited by the electronic component 10f. With the electronic component 10f, the amount of heat generated by the coil conductor layer 30a is made close to the amount of heat generated by the series coil conductor layer 36. The electronic component 10f is easily manufactured, as in the electronic component 10b.

In addition, the flatness of the top face and the bottom face of the multilayer body 22 is improved in the electronic component 10f. More specifically, the dummy conductor layer 100 is overlapped with at least part of the portion that is not overlapped with the coil conductor layer 30a in the coil conductor layer 32a. Accordingly, either of the coil conductor layer 30a and the dummy conductor layer 100 exists at the lower side of each lap of the coil conductor layer 32a. Consequently, the difference in thickness in the vertical direction of the multilayer body 22 is difficult to occur between a portion overlapped with two laps at the outer periphery side of the coil conductor layer 32a on the top face and the bottom face of the multilayer body 22 and a portion overlapped with two laps at the inner periphery side of the coil conductor layer 32a on the top face and the bottom face of the multilayer body 22. As a result, the flatness of the top face and the bottom face of the multilayer body 22 is improved in the electronic component 10f.

Although the electronic component 10f includes one coil conductor layer group Ga, the electronic component 10f may include three or more coil conductor layer groups. A case will now be described in which the electronic component 10f includes n-number (n is a natural number) coil conductor layer groups Ga, Gb, . . . .

When the electronic component 10f includes the n-number coil conductor layer groups Ga, Gb, . . . , it is sufficient for the dummy conductor layer 100 to be overlapped with at least part of a portion that is not overlapped with the coil conductor layer 30a (an example of the primary coil conductor layer closest to the one side of the laminating direction, among the n-number primary coil conductor layers) in the coil conductor layer 32a (an example of the secondary coil conductor layer closest to the one side of the laminating direction, among the n-number secondary coil conductor layers).

The dummy conductor layer 100 may be overlapped with at least part of a portion that is not overlapped with the coil conductor layer 32a in the coil conductor layer 34a (an example of the tertiary coil conductor layer closest to the other side of the laminating direction). The dummy conductor layer 100 may be provided on the same insulating layer as that on which the series coil conductor layer 36 is provided.

(Other Embodiments)

The electronic component according to the present disclosure is not limited to the electronic component 10 and the electronic components 10a to 10f and may be modified within the scope and sprit of the present disclosure.

The configurations of the electronic component 10 and the electronic components 10a to 10f may be arbitrarily combined.

Although the electronic component 10 and the electronic components 10a to 10f are manufactured using the photolithographic method, the electronic component 10 and the electronic components 10a to 10f may be manufactured using, for example, a laminating method of laminating insulating layers on which the coil conductor layers are printed.

Although the conductor layers of the electronic component 10 and the electronic components 10a to 10f are manufactured using a subtractive method, the conductor layers of the electronic component 10 and the electronic components 10a to 10f may be manufactured using, for example, a semi-additive method. A Ti—Cu film may be used, instead of the Ag film, for the conductor layers of the electronic component 10 and the electronic components 10a to 10f.

As described above, the present disclosure is useful for the electronic component. In particular, the present disclosure is excellent in that the difference in differential impedance between the respective coils is capable of being reduced in a common mode filter including three coils.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
 a multilayer body having a plurality of insulating layers laminated in a laminating direction;
 a primary coil including an n-number primary coil conductor layers and one series coil conductor layer provided on the insulating layers, where n is a natural number;
 a secondary coil including an n-number secondary coil conductor layers provided on the insulating layers; and
 a tertiary coil including an n-number tertiary coil conductor layers provided on the insulating layers,
 wherein the primary coil, the secondary coil, and the tertiary coil compose a common mode filter, wherein arrangement of one primary coil conductor layer, one secondary coil conductor layer, and one tertiary coil conductor layer in this order from a first side to a second side of the laminating direction composes one coil conductor layer group, wherein n-number coil conductor layer groups are arranged from the first side to the second side of the laminating direction, and wherein the series coil conductor layer is electrically connected in series to the n-number primary coil conductor layers and is provided at the second side of the laminating direction with respect to the tertiary coil conductor layer closest to the second side of the laminating direction.

2. The electronic component according to claim 1, wherein the n-number primary coil conductor layers include a first primary coil conductor layer to an n-th primary coil conductor layer, and wherein the first primary coil conductor layer to the n-th primary coil conductor layer and the series coil conductor layer are arranged in this order from the first side to the second side of the laminating direction and are electrically connected in series to each other in this order.

3. The electronic component according to claim 1, wherein a sum of a number of turns of the series coil conductor layer and a number of turns of a certain primary coil conductor layer in the n-number primary coil conductor layers is substantially equal to a number of turns of one of the primary coil conductor layers resulting from exclusion of the certain primary coil conductor layer from the n-number primary coil conductor layers.

4. The electronic component according to claim 3, wherein the n-number primary coil conductor layers, the n-number secondary coil conductor layers, the n-number tertiary coil conductor layers, and the series coil conductor layer each form a spiral shape in which lines that are adjacent to each other in a radial direction are spaced at substantially the same distance, viewed from the laminating direction, wherein the number of turns of the certain primary coil conductor layer is substantially half of a number of turns of the secondary coil conductor layer adjacent to the certain primary coil conductor layer in the laminating direction, wherein the number of turns of the series coil conductor layer is substantially half of a number of turns of the tertiary coil conductor layer closest to the second side of the laminating direction, among the n-number tertiary coil conductor layer, wherein an intermediate line between a portion winding at an outermost side of the certain primary coil conductor layer and a portion winding at an innermost side thereof is at least partially overlapped with an intermediate line between a portion winding at an outermost side of the secondary coil conductor layer adjacent to the certain primary coil conductor layer in the laminating direction and a portion winding at an innermost side thereof, viewed from the laminating direction, and wherein an intermediate line between a portion winding at an outermost side of the series coil conductor layer and a portion winding at an innermost side thereof is at least partially overlapped with an intermediate line between a portion winding at an outermost side of the tertiary coil conductor layer closest to the second side of the laminating direction, among the n-number tertiary coil conductor layers, and a portion winding at an innermost side thereof, viewed from the laminating direction.

5. The electronic component according to claim 3, wherein the n-number primary coil conductor layers, the n-number secondary coil conductor layers, the n-number tertiary coil conductor layers, and the series coil conductor layer each form a spiral shape in which lines that are adjacent to each other in a radial direction are spaced at substantially the same distance, viewed from the laminating direction, wherein a portion winding at an outermost side of the certain primary coil conductor layer is at least partially overlapped with a portion winding at an outermost side of the secondary coil conductor layer adjacent to the primary coil conductor layer in the laminating direction, viewed from the laminating direction, and wherein a portion winding at an innermost side of the series coil conductor layer is at least partially overlapped with a portion winding at an innermost side of the tertiary coil conductor layer closest to the second side of the laminating direction, among the n-number tertiary coil conductor layers, viewed from the laminating direction.

6. The electronic component according to claim 3, wherein the n-number primary coil conductor layers, the n-number secondary coil conductor layers, the n-number tertiary coil conductor layers, and the series coil conductor layer each form a spiral shape in which lines that are adjacent to each other in a radial direction are spaced at substantially the same distance, viewed from the laminating direction, wherein a portion winding at an innermost side of the certain primary coil conductor layer is at least partially overlapped with a portion winding at an innermost side of the secondary coil conductor layer adjacent to the primary coil conductor layer in the laminating direction, viewed from the laminating direction, and wherein a portion winding at an outermost side of the series coil conductor layer is at least partially overlapped with a portion winding at an outermost side of the tertiary coil conductor layer closest to the second side of the laminating direction, among the n-number tertiary coil conductor layers, viewed from the laminating direction.

7. The electronic component according to claim 3, further comprising:

a dummy conductor layer that is provided on the insulating layer on which the certain primary coil conductor layer is provided, the dummy conductor layer being at least partially overlapped with a portion that is not overlapped with the certain primary coil conductor layer in the secondary coil conductor layer adjacent to the certain primary coil conductor layer in the laminating direction, wherein the dummy conductor layer is not electrically connected to the n-number primary coil conductor layers, the n-number secondary coil conductor layers, the n-number tertiary coil conductor layers, and the series coil conductor layer.

8. The electronic component according to claim 3, wherein the number of turns of the certain primary coil conductor layer is substantially equal to the number of turns of the series coil conductor layer.

9. The electronic component according to claim 1,
wherein n is an odd number,
wherein the n-number primary coil conductor layers include a first primary coil conductor layer to an n-th primary coil conductor layer,
wherein m-th primary coil conductor layers each form a spiral shape in which the coil conductor winds in a certain direction from an outer periphery side to an inner periphery side, viewed from the first side of the laminating direction, where m denotes all odd numbers not smaller than one and not greater than n,
wherein k-th primary coil conductor layers and the series coil conductor layer each form a spiral shape in which the coil conductor winds in the certain direction from the inner periphery side to the outer periphery side, viewed from the first side of the laminating direction, where k denotes all even numbers not smaller than two and not greater than n−1, and
wherein the first primary coil conductor layer to the n-th primary coil conductor layer and the series coil conductor layer are electrically connected in series to each other in this order.

10. The electronic component according to claim 9,
wherein the n-number secondary coil conductor layers include a first secondary coil conductor layer to an n-th secondary coil conductor layer,
wherein m-th secondary coil conductor layers each form a spiral shape in which the coil conductor winds in the certain direction from the outer periphery side to the inner periphery side, viewed from the first side of the laminating direction,
wherein k-th secondary coil conductor layers each form a spiral shape in which the coil conductor winds in the certain direction from the inner periphery side to the outer periphery side, viewed from the first side of the laminating direction,
wherein the first secondary coil conductor layer to the n-th secondary coil conductor layer are electrically connected in series to each other in this order,
wherein the n-number tertiary coil conductor layers include a first tertiary coil conductor layer to an n-th tertiary coil conductor layer,
wherein m-th tertiary coil conductor layers each form a spiral shape in which the coil conductor winds in the certain direction from the outer periphery side to the inner periphery side, viewed from the first side of the laminating direction,
wherein k-th tertiary coil conductor layers each form a spiral shape in which the coil conductor winds in the certain direction from the inner periphery side to the outer periphery side, viewed from the first side of the laminating direction, and
wherein the first tertiary coil conductor layer to the n-th tertiary coil conductor layer are electrically connected in series to each other in this order,
the electronic component further comprising:
a first outer electrode,
a first extended portion that electrically connects an end portion at the outer periphery side of the series coil conductor layer to the first outer electrode,
a second outer electrode,
a second extended portion that electrically connects an end portion at the inner periphery side of the n-th secondary coil conductor layer to the second outer electrode,
a third outer electrode, and
a third extended portion that electrically connects an end portion at the inner periphery side of the n-th tertiary coil conductor layer to the third outer electrode,
wherein the second extended portion includes a first extended conductor layer overlapped with part of the series coil conductor layer, viewed from the laminating direction, and
wherein the third extended portion includes a second extended conductor layer overlapped with part of the series coil conductor layer, viewed from the laminating direction.

11. The electronic component according to claim 9,
wherein the n-number secondary coil conductor layers include a first secondary coil conductor layer to an n-th secondary coil conductor layer,
wherein m-th secondary coil conductor layers each form a spiral shape in which the coil conductor winds in the certain direction from the outer periphery side to the inner periphery side, viewed from the first side of the laminating direction,
wherein k-th secondary coil conductor layers each form a spiral shape in which the coil conductor winds in the certain direction from the inner periphery side to the outer periphery side, viewed from the first side of the laminating direction,
wherein the first secondary coil conductor layer to the n-th secondary coil conductor layer are electrically connected in series to each other in this order,
wherein the n-number tertiary coil conductor layers include a first tertiary coil conductor layer to an n-th tertiary coil conductor layer,
wherein m-th tertiary coil conductor layers each form a spiral shape in which the coil conductor winds in the certain direction from the outer periphery side to the inner periphery side, viewed from the first side of the laminating direction,
wherein k-th tertiary coil conductor layers each form a spiral shape in which the coil conductor winds in the certain direction from the inner periphery side to the outer periphery side, viewed from the first side of the laminating direction, and
wherein the first tertiary coil conductor layer to the n-th tertiary coil conductor layer are electrically connected in series to each other in this order,
the electronic component further comprising:
a first outer electrode,
a first extended portion that electrically connects an end portion at the outer periphery side of the series coil conductor layer to the first outer electrode,
a second outer electrode,
a second extended portion that electrically connects an end portion at the inner periphery side of the n-th secondary coil conductor layer to the second outer electrode,
a third outer electrode, and
a third extended portion that electrically connects an end portion at the inner periphery side of the n-th tertiary coil conductor layer to the third outer electrode,
wherein the second extended portion includes a first extended conductor layer provided at the outer periphery side of the series coil conductor layer on the insulating layer on which the series coil conductor layer is provided, and
wherein the third extended portion includes a second extended conductor layer provided at the outer periphery side of the series coil conductor layer on the insulating layer on which the series coil conductor layer is provided.

12. The electronic component according to claim 1, wherein cross-sectional area of each of the n-number primary coil conductor layers, a cross-sectional area of the series coil conductor layer, cross-sectional area of each of the n-number secondary coil conductor layers, and cross-sectional area of each of the n-number tertiary coil conductor layers are substantially equal to each other.

13. The electronic component according to claim 1, wherein spacings in the laminating direction between adjacent coil conductor layers, among the n-number primary coil conductor layers, the n-number secondary coil conductor layers, the n-number tertiary coil conductor layer, and the series coil conductor layer, are substantially equal to each other.

* * * * *